(12) United States Patent
Chen et al.

(10) Patent No.: US 12,130,527 B2
(45) Date of Patent: Oct. 29, 2024

(54) DISPLAY PANEL AND DISPLAY DEVICE

(71) Applicant: BOE Technology Group Co., Ltd., Beijing (CN)

(72) Inventors: Liang Chen, Beijing (CN); Minghua Xuan, Beijing (CN); Dongni Liu, Beijing (CN); Haoliang Zheng, Beijing (CN); Li Xiao, Beijing (CN); Zhenyu Zhang, Beijing (CN); Hao Chen, Beijing (CN); Ke Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/465,273

(22) Filed: Sep. 12, 2023

(65) Prior Publication Data

US 2023/0418122 A1 Dec. 28, 2023

Related U.S. Application Data

(63) Continuation of application No. 17/984,469, filed on Nov. 10, 2022, now Pat. No. 11,796,877, which is a continuation of application No. 17/281,709, filed as application No. PCT/CN2020/071545 on Jan. 10, 2020, now Pat. No. 11,537,018.

(51) Int. Cl.
*G02F 1/1362* (2006.01)
*H10K 59/131* (2023.01)

(52) U.S. Cl.
CPC ..... *G02F 1/136286* (2013.01); *H10K 59/131* (2023.02)

(58) Field of Classification Search
CPC .......... G02F 1/136286; G02F 1/13452; H01L 27/3276; H10K 59/131
See application file for complete search history.

(56) References Cited

U.S. PATENT DOCUMENTS

| 9,772,523 B2 | 9/2017 | Lim | |
|---|---|---|---|
| 2015/0340419 A1* | 11/2015 | Li | H10K 59/123 438/151 |
| 2017/0294496 A1 | 10/2017 | Wang | |

(Continued)

FOREIGN PATENT DOCUMENTS

| CN | 105206625 A | 12/2015 |
|---|---|---|
| CN | 106057820 A | 10/2016 |

(Continued)

OTHER PUBLICATIONS

Non Final Office Action U.S. Appl. No. 17/281,709 issued on May 24, 2022.

(Continued)

*Primary Examiner* — James A Dudek
(74) *Attorney, Agent, or Firm* — ArentFox Schiff LLP; Michael Fainberg

(57) ABSTRACT

The present disclosure discloses a display panel and a display device. The display panel includes: a base substrate, including a plurality of substrate via holes located in a display area of the display panel; and a plurality of driving signal lines and a plurality of bonding terminals, respectively located on different sides of the base substrate. At least one of the plurality of driving signal lines is electrically connected to at least one of the plurality of bonding terminals through the substrate via hole(s).

18 Claims, 18 Drawing Sheets

(56) References Cited

U.S. PATENT DOCUMENTS

2019/0051668 A1    2/2019   Huang et al.
2019/0371707 A1*  12/2019   Yueh .................. H01L 23/4985
2021/0210522 A1    7/2021   Liu et al.

FOREIGN PATENT DOCUMENTS

| CN | 107331294 A | 11/2017 |
| CN | 107463045 A | 12/2017 |
| CN | 109585462 A | 4/2019 |
| CN | 109599421 A | 4/2019 |
| IN | 109671352 A | 4/2019 |

OTHER PUBLICATIONS

Notice of Allowance for U.S. Appl. No. 17/281,709 issued on Dec. 7, 2022.
Non Final Office Action U.S. Appl. No. 17/984,469 issued on Jun. 30, 2023.
Non Final Office Action U.S. Appl. No. 17/984,469 issued on Mar. 1, 2023.

\* cited by examiner

-- Prior Art --

DISPLAY PANEL AND DISPLAY DEVICE

CROSS-REFERENCE TO RELATED APPLICATIONS

This application is a continuation of U.S. patent application Ser. No. 17/984,469, filed Nov. 10, 2022, which is a continuation of U.S. patent application Ser. No. 17/281,709, filed Mar. 31, 2021, which is a continuation of International Application No. PCT/CN2020/071545, filed Jan. 10, 2020. The afore-mentioned patent applications are hereby incorporated by reference in their entireties.

FIELD

The present disclosure relates to the technical field of display, in particular to a display panel and a display device.

BACKGROUND

With the continuous development of a display technology, consumers have higher and higher requirements for the screen-to-body ratio, which requires display panels to have a smaller bezel width. However, display panels and flexible circuit boards (FPCs) usually achieve bonding at edges of the display panels, which is not conducive to achieving narrow bezels.

SUMMARY

Embodiments of the present disclosure provide a display panel, including:
- a base substrate, including a plurality of substrate via holes in a display area of the display panel; and
- a plurality of driving signal lines and a plurality of bonding terminals, respectively on different surface sides of the base substrate.

At least one of the plurality of driving signal lines is electrically connected to at least one of the plurality of bonding terminals through the substrate via hole(s).

Optionally, in embodiments of the present disclosure, the display area further includes:
- a plurality of first fan-out lines, on the side, facing away from the driving signal lines of the base substrate.

One first fan-out line in the plurality of first fan-out lines is electrically connected to one bonding terminal in the plurality of bonding terminals.

One of the driving signal lines is correspondingly electrically connected to at least one of the first fan-out lines through the substrate via hole(s).

Optionally, in embodiments of the present disclosure, the display area further includes:
- a first insulating layer, between a layer where the driving signal lines are located and the base substrate, the first insulating layer being provided with a plurality of first via holes; and
- a plurality of first auxiliary lines, between the first insulating layer and the base substrate.

One of the driving signal lines is correspondingly electrically connected to one of the first auxiliary lines through the first via hole(s), and one of the first auxiliary lines is correspondingly electrically connected to at least one of the first fan-out lines through the substrate via hole(s).

Optionally, in embodiments of the present disclosure, orthographic projections of the driving signal line and the first auxiliary line corresponding to each other on the base substrate at least partially overlap, and the driving signal line and the first auxiliary line corresponding to each other are electrically connected through at least two of the plurality of spaced first via holes, and the at least two first via holes are spaced.

Optionally, in embodiments of the present disclosure, for the at least two first via holes corresponding to the same driving signal line, a space between every adjacent two of the at least two first via holes is the same.

Optionally, in embodiments of the present disclosure, a distance from an orthographic projection of each of the bonding terminals on the base substrate to an orthographic projection of the corresponding substrate via hole on the base substrate is substantially the same.

Optionally, in embodiments of the present disclosure, an area where the bonding terminals are located has a first side and a second side opposite to each other. The first side and the second side are arranged along a first direction.

The plurality of substrate via holes are located in at least one side in the first side and the second side.

Optionally, in embodiments of the present disclosure, a part of the substrate via holes in the plurality of substrate via holes are located in the first side, and the remaining part of the substrate via holes in the plurality of substrate via holes are located in the second side.

Optionally, in embodiments of the present disclosure, the substrate via holes corresponding to the odd-numbered first fan-out lines along the second direction are located in the first side, and the substrate via holes corresponding to the even-numbered first fan-out lines are located in the second side.

Optionally, in embodiments of the present disclosure, one of the first fan-out lines corresponds to one of the substrate via holes, and one of the first auxiliary lines is correspondingly electrically connected to two of the first fan-out lines through the substrate via holes.

One substrate via hole corresponding to the same first auxiliary line is located in the first side of the area where the bonding terminals are located, and the other substrate via hole corresponding to the same first auxiliary line is located in the second side of the area where the bonding terminals are located.

Optionally, in embodiments of the present disclosure, the display panel further includes:
- a second insulating layer, between a layer where the first fan-out lines are located and the base substrate, the second insulating layer being provided with a plurality of second via holes; and
- a plurality of second auxiliary lines, between the second insulating layer and the base substrate.

One of the driving signal lines is correspondingly electrically connected to one of the second auxiliary lines through the substrate via hole(s).

One of the second auxiliary lines is correspondingly electrically connected to one of the first fan-out lines through the second via hole(s).

Optionally, in embodiments of the present disclosure, orthographic projections of the driving signal line and the second auxiliary line corresponding to each other on the base substrate at least partially overlap, and the driving signal line and the second auxiliary line corresponding to each other are electrically connected through at least two of the plurality of substrate via holes. The at least two substrate via holes are spaced.

Optionally, in embodiments of the present disclosure, for the substrate via holes corresponding to the same driving signal line, a space between every adjacent two of the substrate via holes is the same.

Optionally, in embodiments of the present disclosure, the substrate via holes corresponding to every two adjacent driving signal lines are arranged on a straight line along a second direction.

Optionally, in embodiments of the present disclosure, the substrate via holes corresponding to every two adjacent driving signal lines are arranged in a staggered manner.

Optionally, in embodiments of the present disclosure, the driving signal lines extend along a first direction, and the display area has a symmetry axis along a second direction; the first direction and the second direction are different; and all the second via holes are located in the symmetry axis of the display area.

Optionally, in embodiments of the present disclosure, the display area further includes:
  a plurality of second fan-out lines, between a layer where the driving signal lines are located and the base substrate; and
  a third insulating layer, between the layer where the driving signal lines are located and a layer where the second fan-out lines are located, the third insulating layer being provided with a plurality of third via holes.

One of the driving signal lines is correspondingly electrically connected to one of the second fan-out lines through the third via hole(s), and one of the second fan-out lines is correspondingly electrically connected to one of the bonding terminals through the substrate via hole(s).

Optionally, in embodiments of the present disclosure, the driving signal lines extend along a first direction, and the display area has a symmetry axis along a second direction; the first direction and the second direction are different.

One of the driving signal lines corresponds to one of the substrate via holes, and the substrate via holes are located in an area from the symmetry axis to an edge of the display area.

Optionally, in embodiments of the present disclosure, all the substrate via holes are arranged on a straight line along the second direction.

Optionally, in embodiments of the present disclosure, all the substrate via holes are located in the same side of the symmetry axis and are close to the edge of the display area.

Optionally, in embodiments of the present disclosure, all the substrate via holes are located in the symmetry axis.

Optionally, in embodiments of the present disclosure, the driving signal lines include at least one of data lines, first power lines and second power lines.

An embodiment of the present disclosure further provides a display device, including the above-mentioned display panel.

DETAILED DESCRIPTION OF THE EMBODIMENTS

Figure 1:
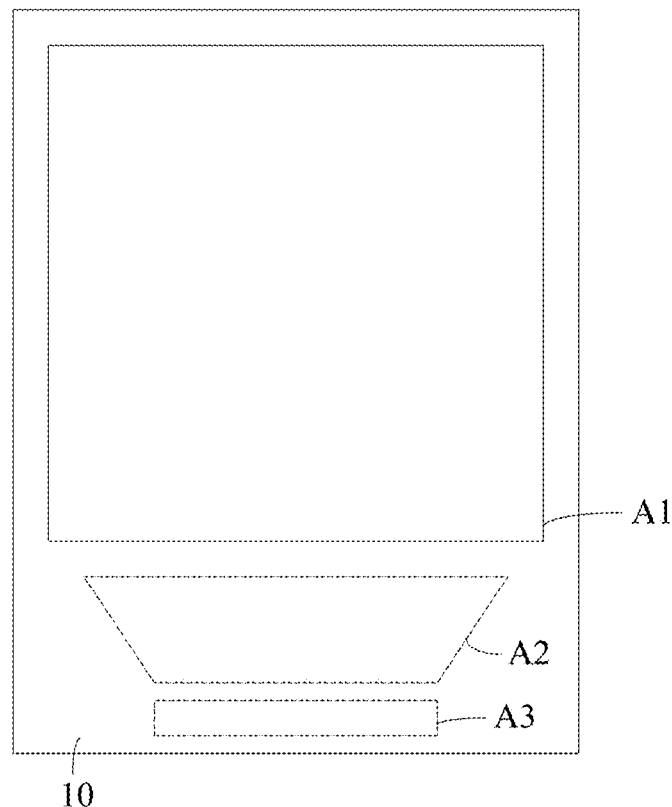
FIG. 1 is a schematic structural top view of a display panel in the related art.

To make the objectives, technical solutions and advantages of the embodiments of the present disclosure clearer, the technical solutions of the embodiments of the present disclosure will be described clearly and completely below in conjunction with the accompanying drawings of the embodiments of the present disclosure. Obviously, the described embodiments are a part of the embodiments of the present disclosure, but not all the embodiments. In the case of no conflict, the embodiments in the present disclosure and the features in the embodiments may be combined with each other. Based on the described embodiments of the present disclosure, all other embodiments obtained by those of ordinary skill in the art without creative work fall within the protection scope of the present disclosure.

Unless otherwise defined, the technical terms or scientific terms used in the present disclosure shall have the ordinary meanings understood by persons of ordinary skill in the art to which the present disclosure belongs. The terms "first", "second" and similar words used in the present disclosure do not indicate any order, quantity or importance, but are only used to distinguish different components. Similar words such as "comprise" or "include" or the like mean that the elements or objects appearing before the word cover the elements or objects listed after the word and their equivalents, but do not exclude other elements or objects. Similar words such as "connected to" or "connected with" or the like are not limited to physical or mechanical connections, but may include electrical connections, whether direct or indirect.

It should be noted that the shape and size of each graph in the accompanying drawings do not reflect the true scale, and are merely intended to illustrate the contents of the present disclosure. The same or similar reference numerals indicate the same or similar elements or elements having the same or similar functions throughout.

Figure 2:
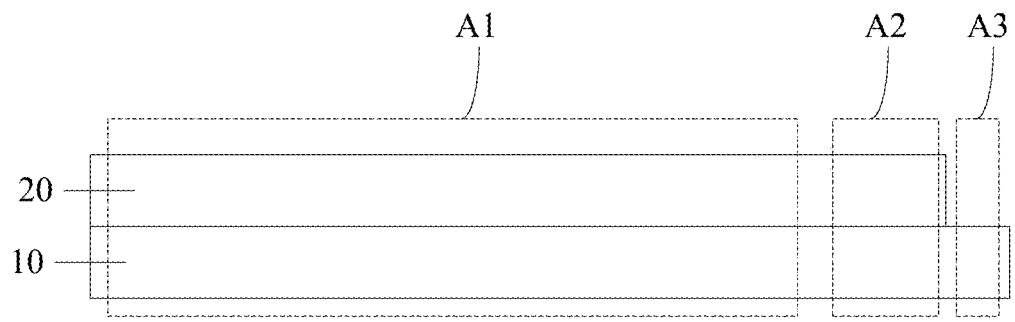
FIG. 2 is a schematic structural cross-sectional view of the display panel shown in FIG. 1.

As shown in FIG. 1 and FIG. 2, FIG. 1 is a schematic structural top view of a display panel, and FIG. 2 is a schematic structural cross-sectional view of an array substrate in the display panel. The display panel may include an array substrate 10 and an opposite substrate 20 disposed oppositely. The display panel has a display area A1, a fan-out area A2 and a bonding area A3. Signal lines are disposed in the display area A1, fan-out lines are disposed in the fan-out area A2, bonding terminals are disposed in the bonding area A3, and the bonding terminals are bonded with a flexible circuit board, such that signals transmitted by the flexible circuit board are input to the signal lines sequentially through the bonding terminals and the fan-out lines.

Usually, whether using a COF (Chip On Film) technology or a COG (Chip On Glass, that is, a chip is directly bonded on the glass substrate) technology, a bezel on the side where the display panel is bonded with the flexible circuit board needs to have a certain width. In a side corresponding to a non-bonding area of the display panel, edges of the array substrate and the opposite substrate can be aligned. However, in a side corresponding to a bonding area of the display panel, since the array substrate is provided with the bonding terminals that need to be electrically connected to the flexible circuit board, edges of the array substrate and the opposite substrate cannot be aligned. Therefore, the bezel corresponding to the side of the bonding area of the display panel is still wider while the bezels on other sides of the display panel are extremely narrow.

Figure 3:
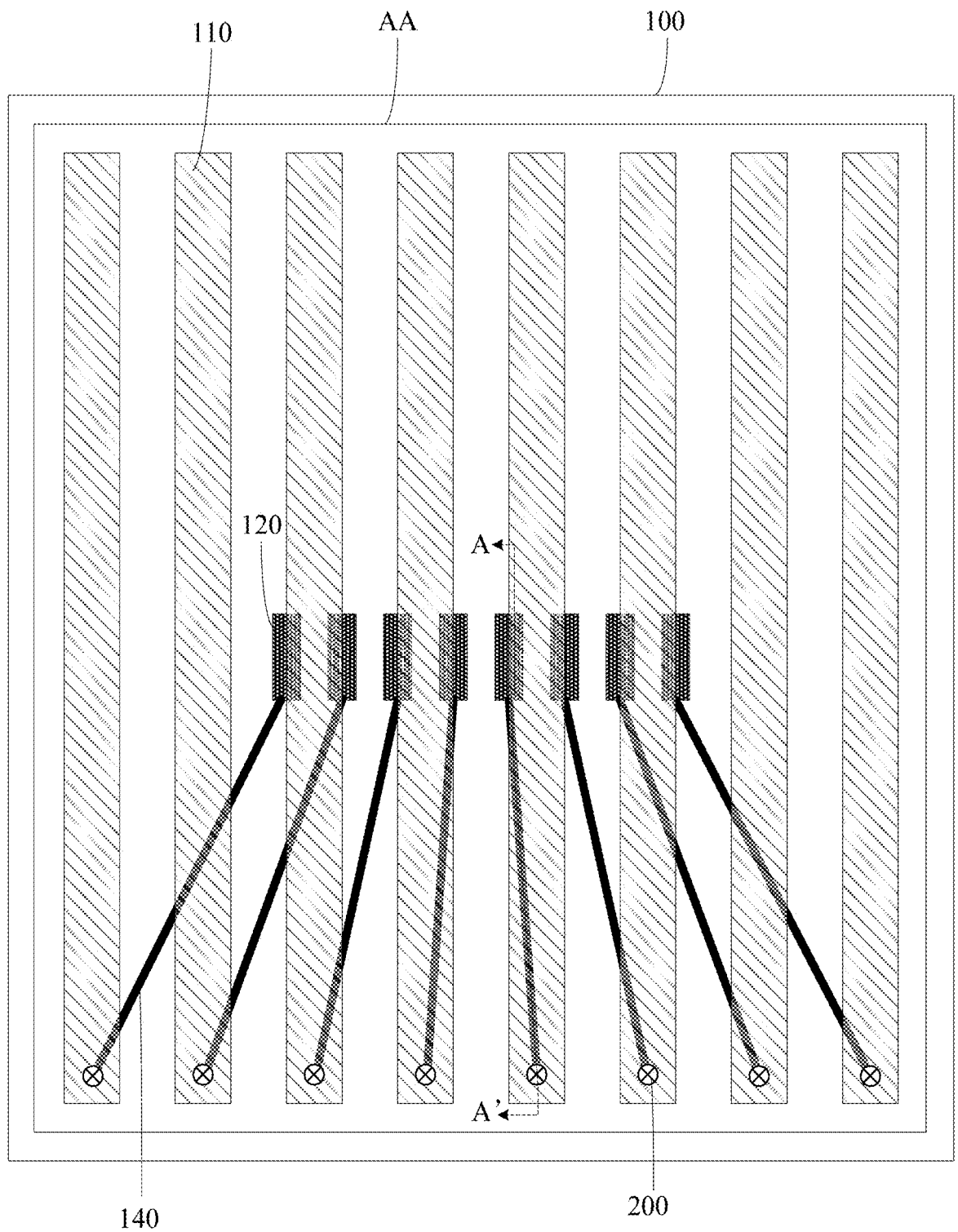
FIG. 3 is a schematic structural top view of a display panel according to an embodiment of the present disclosure.
Figure 4A:
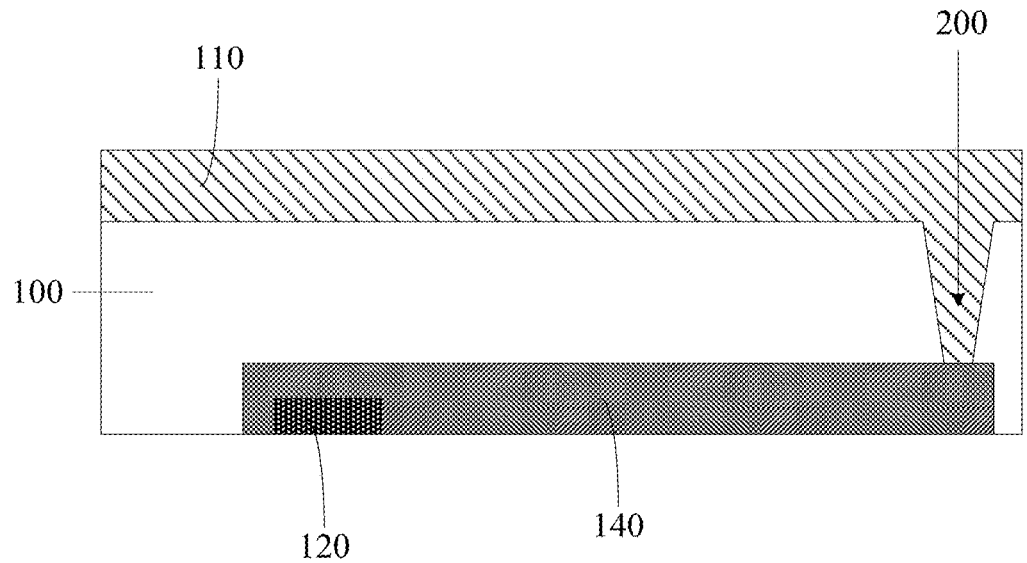
FIG. 4A is a schematic structural cross-sectional view of the display panel shown in FIG. 3 along direction AA'.

In view of this, embodiments of the present disclosure provide a display panel, as shown in FIG. 3 and FIG. 4A, which may include a base substrate 100, a plurality of driving signal lines 110 and a plurality of bonding terminals 120.

The base substrate 100 includes a plurality of substrate via holes 200 in a display area AA of the display panel. For example, the substrate via holes 200 may penetrate through the base substrate 100.

The plurality of driving signal lines 110 and the plurality of bonding terminals 120 are respectively located on different surface sides of the base substrate 100. For example, the plurality of driving signal lines 110 are located on a surface side M1 of the base substrate 100, and all the driving signal lines 110 are located in the display area AA. The plurality of bonding terminals 120 are located on a surface side M2, facing away from the driving signal lines 110, of the base substrate 100, and orthographic projections of the bonding terminals 120 on the base substrate 100 are located in the display area AA.

At least one of the plurality of driving signal lines 110 is electrically connected to at least one of the plurality of bonding terminals 120 through the substrate via hole 200.

According to the above-mentioned display panel provided by the embodiments of the present disclosure, by locating the orthographic projections of the bonding terminals on the base substrate in the display area, the bonding terminals can be disposed in the display area in a direction perpendicular to a plane where the base substrate is located. Besides, by locating the bonding terminals and the driving signal lines respectively on different surface sides of the base substrate and by disposing the substrate via holes penetrating through the base substrate in the display area such that the driving signal lines can be electrically connected to the bonding terminals through the substrate via holes. After the bonding terminals are electrically connected to the flexible circuit board, the flexible circuit board can transmit signals to the driving signal lines through the bonding terminals. Thus, in the direction perpendicular to the plane where the base substrate is located, the bonding terminals are disposed in the display area, and the bonding terminals are electrically connected to the flexible circuit board and other components, such that the width of the bezel of the display panel can be greatly reduced, thereby achieving a narrow-bezel effect.

Figure 5:
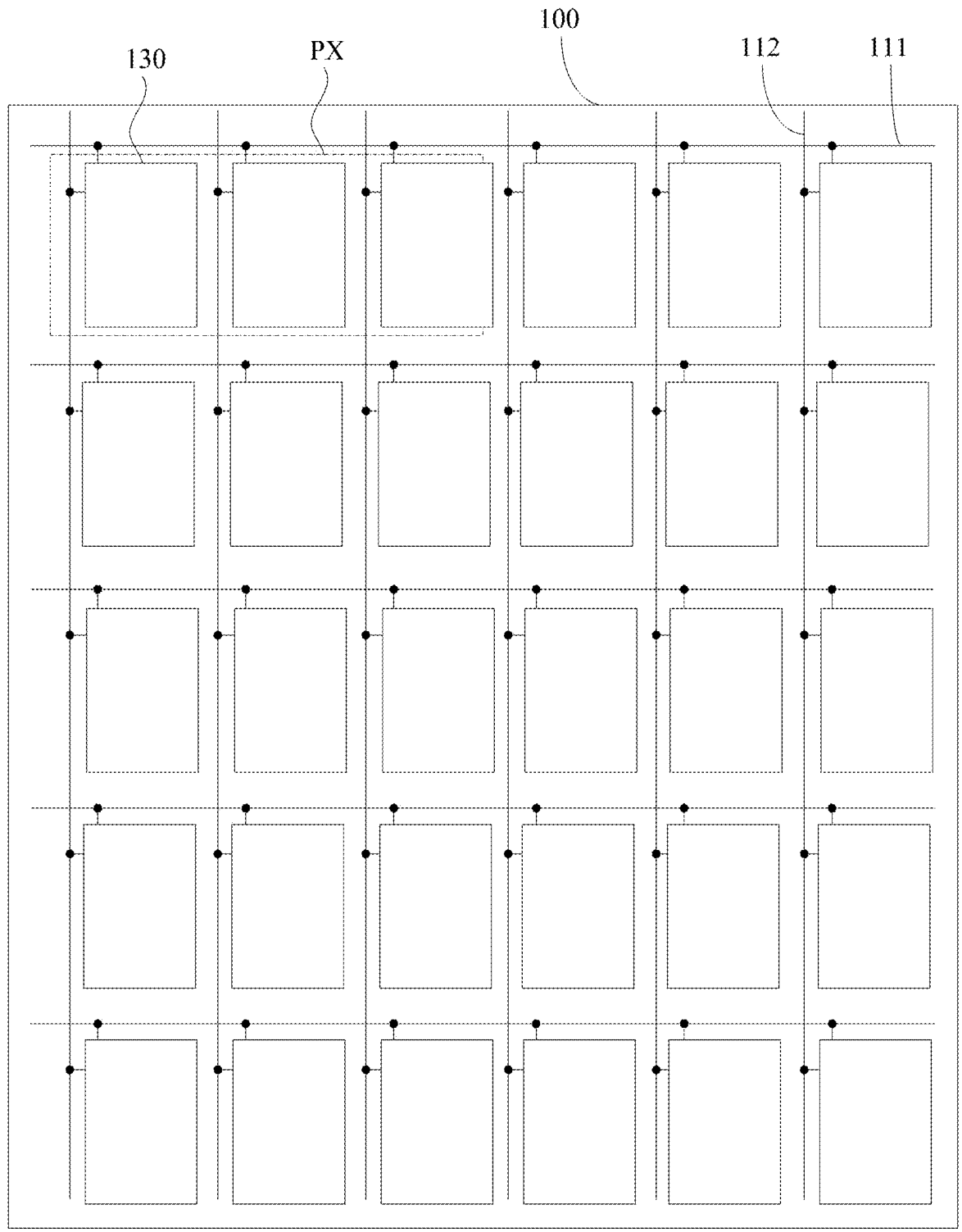
FIG. 5 is a schematic structural view of a display panel according to an embodiment of the present disclosure.

In some embodiments, as shown in FIG. 3 and FIG. 5, the display panel includes a plurality of pixel units PX, a plurality of gate lines 111 and a plurality of data lines 112. Each of the pixel units PX includes a plurality of sub-pixels 130, one row of the sub-pixels are correspondingly electrically connected to at least one gate line, and one column of the sub-pixels are correspondingly electrically connected to at least one data line. The sub-pixels 130 are arranged in the display area AA of the display panel in an array. Exemplarily, the pixel unit may include a red sub-pixel, a green sub-pixel and a blue sub-pixel, and thus, red, green and blue can be mixed to realize color display. Alternatively, the pixel unit may include a red sub-pixel, a green sub-pixel, a blue sub-pixel and a white sub-pixel, and thus, red, green, blue and white can be mixed to realize color display. Of course, in practical applications, the light emitting colors of the sub-pixels in the pixel unit can be designed and determined according to a practical application environment, which is not limited herein.

In some implementations, the display panel in the embodiments of the present disclosure may be a liquid crystal display panel. Further, each of the sub-pixels may include a pixel electrode and a thin-film transistor (TFT). Exemplarily, one row of the sub-pixels are correspondingly electrically connected to one gate line, and one column of the sub-pixels are correspondingly electrically connected to one data line. Specifically, gates of the TFTs in one row of the sub-pixels are electrically connected to one gate line, sources of the TFTs in one column of the sub-pixels are electrically connected to one data line, and a drain of the TFT in each of the sub-pixels is electrically connected to the pixel electrode. The TFT can be turned on under the control of a signal transmitted on the gate line so as to turn on the pixel electrode and the data line. Besides, the specific structure of the liquid crystal display panel may be basically the same as that in the related art, and will not be repeated herein.

Organic light emitting diodes (OLEDs), quantum dot light emitting diodes (QLEDs), micro light emitting diodes (micro LEDs) and other electroluminescent diodes have the advantages such as self-luminescence and low energy consumption. In some implementations, the display panel in the embodiments of the present disclosure may be an electroluminescent display panel. In embodiments of the present disclosure, the sub-pixel may include an electroluminescent diode and a pixel circuit for driving the electroluminescent diode to emit light. The electroluminescent diode includes an anode, a light emitting layer and a cathode that are stacked. Further, the electroluminescent diode may include: at least one of an OLED, a QLED and a micro LED. Besides, the pixel circuit may generally include a plurality of transistors such as a driving transistor and a switching transistor, and a storage capacitor. The specific structure and working principle of the pixel circuit may be the same as those in the related art, and will not be repeated herein.

Exemplarily, when the display panel is configured as an electroluminescent display panel, the display area AA may be further provided with: light emitting control signal lines, reference voltage signal lines, initialization signal lines, first power lines, second power lines and other signal lines. The light emitting control signal lines can be used to transmit light emitting control signals, the reference voltage signal lines can be used to transmit reference voltage signals with fixed voltage values, the initialization signal lines can be used to transmit initialization signals with fixed voltage values, the first power lines can be used to transmit high-voltage power signals with fixed voltage values, and the second power lines can be used to transmit low-voltage power signals with fixed voltage values. The specific structure and working principle of the electroluminescent display panel may be the same as those in the related art, and will not be repeated herein.

In some implementations, in embodiments of the present disclosure, the driving signal lines 110 may include at least one of data lines, first power lines and second power lines. Exemplarily, the driving signal lines 110 may be configured as data lines, so that signals can be transmitted to the data lines through the above-mentioned bonding terminals 120. Exemplarily, the driving signal lines 110 may be configured as first power lines, so that high-voltage signals can be transmitted to the first power lines through the above-mentioned bonding terminals 120. Exemplarily, the driving signal lines 110 may be configured as second power lines, so that low-voltage signals can be transmitted to the second power lines through the above-mentioned bonding terminals 120. Exemplarily, the driving signal lines 110 may also be configured as data lines, first power lines and second power lines, so that corresponding signals can be transmitted to the data lines, the first power lines and the second power lines through the above-mentioned bonding terminals 120. In practical applications, the driving signal lines may be designed and determined according to a practical application environment, which is not limited herein.

In some implementations, in embodiments of the present disclosure, the base substrate 100 may be configured as a glass substrate, a flexible substrate, a silicon substrate or the like, which is not limited herein. The flexible substrate may include a PI (polyimide) substrate. In practical applications, the base substrate may be designed and determined according to a practical application environment, which is not limited herein.

Besides, due to the large thickness of the glass substrate and the limitation of process conditions, it is relatively difficult to prepare via holes in the glass substrate, and the permeability of the prepared via holes in the glass substrate is relatively poor. Therefore, in embodiments of the present disclosure, the base substrate 100 may be configured as a PI substrate. Due to smaller thickness and higher material flexibility of the PI substrate, compared with a process for forming via holes in the glass substrate, a process for forming penetrating via holes in the PI substrate is less difficult, and the permeability of the formed via holes is better in the PI substrate.

In some implementations, in embodiments of the present disclosure, as shown in FIG. 3 and FIG. 4A, the display area AA may further include: a plurality of first fan-out lines, located on the side, facing away from the driving signal lines 110, of the base substrate 100. One first fan-out line 140 in the plurality of first fan-out lines is electrically connected to one bonding terminal 120 in the plurality of bonding terminals 120. One of the driving signal lines 110 is correspondingly electrically connected to at least one of the first fan-out lines 140 through the substrate via hole 200. Exemplarily, one of the driving signal lines 110 may correspond to one of the first fan-out lines 140, so that one of the driving signal lines 110 may be correspondingly electrically connected to one of the first fan-out lines 140 through the substrate via hole 200. Besides, one of the driving signal lines 110 may correspond to one of the substrate via holes 200, so that one of the driving signal lines 110 is correspondingly electrically connected to one of the first fan-out lines 140 through one of the substrate via holes 200. Alternatively, one of the driving signal lines 110 may also correspond to a plurality of substrate via holes 200, so that one of the driving signal lines 110 may be correspondingly electrically connected to one of the first fan-out lines 140 through the plurality of substrate via holes 200.

Figure 4B:
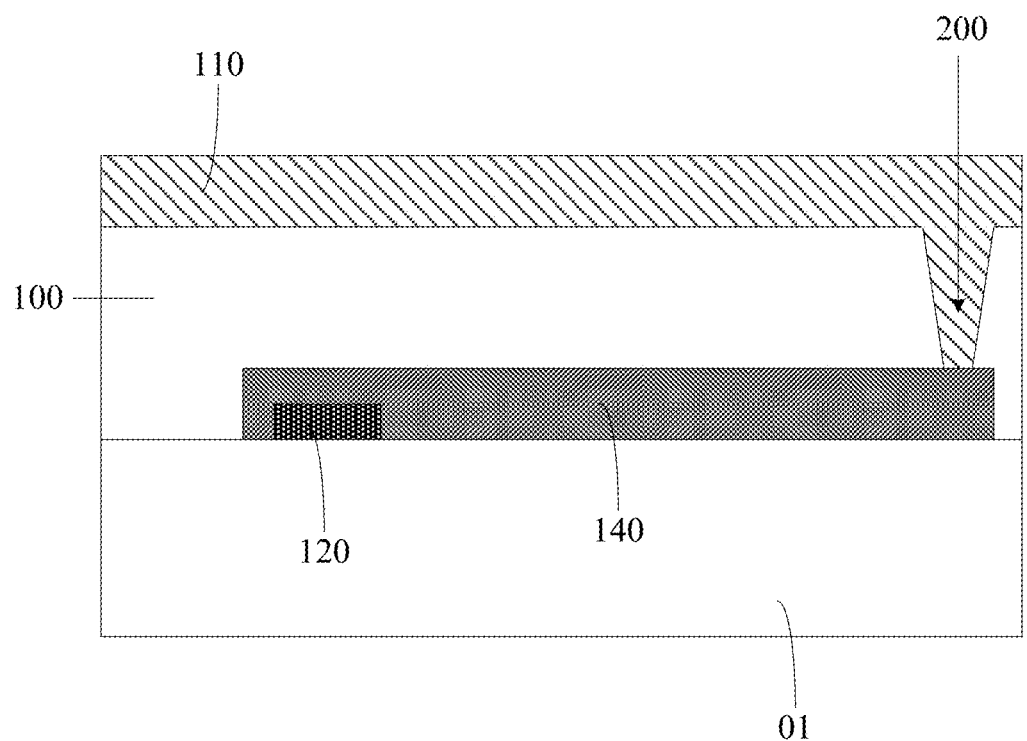
FIG. 4B is a schematic structural cross-sectional view of a display panel in a preparation process according to an embodiment of the present disclosure.

It should be noted that, in some implementations, in embodiments of the present disclosure, if the base substrate 100 is made of a flexible material, such as polyimide, during the preparation of the above-mentioned display panel, as shown in FIG. 4B, firstly, a rigid substrate 01 may be provided, bonding terminals 120 and first fan-out lines 140 are prepared on the rigid substrate 01, and then, a PI layer, that is, the base substrate 100, is prepared; and then, driving signal lines 110 are prepared, micro LEDs are bonded, and after all the layers required in the display panel are prepared, the rigid substrate is peeled off. Exemplarily, the rigid substrate may be peeled off by etching or laser to obtain a flexible display panel. Exemplarily, the rigid substrate may include a glass substrate or a silicon substrate. In embodiments of the present disclosure, a glass substrate may be adopted as the rigid substrate preferentially, which can reduce the cost.

Figure 6A:
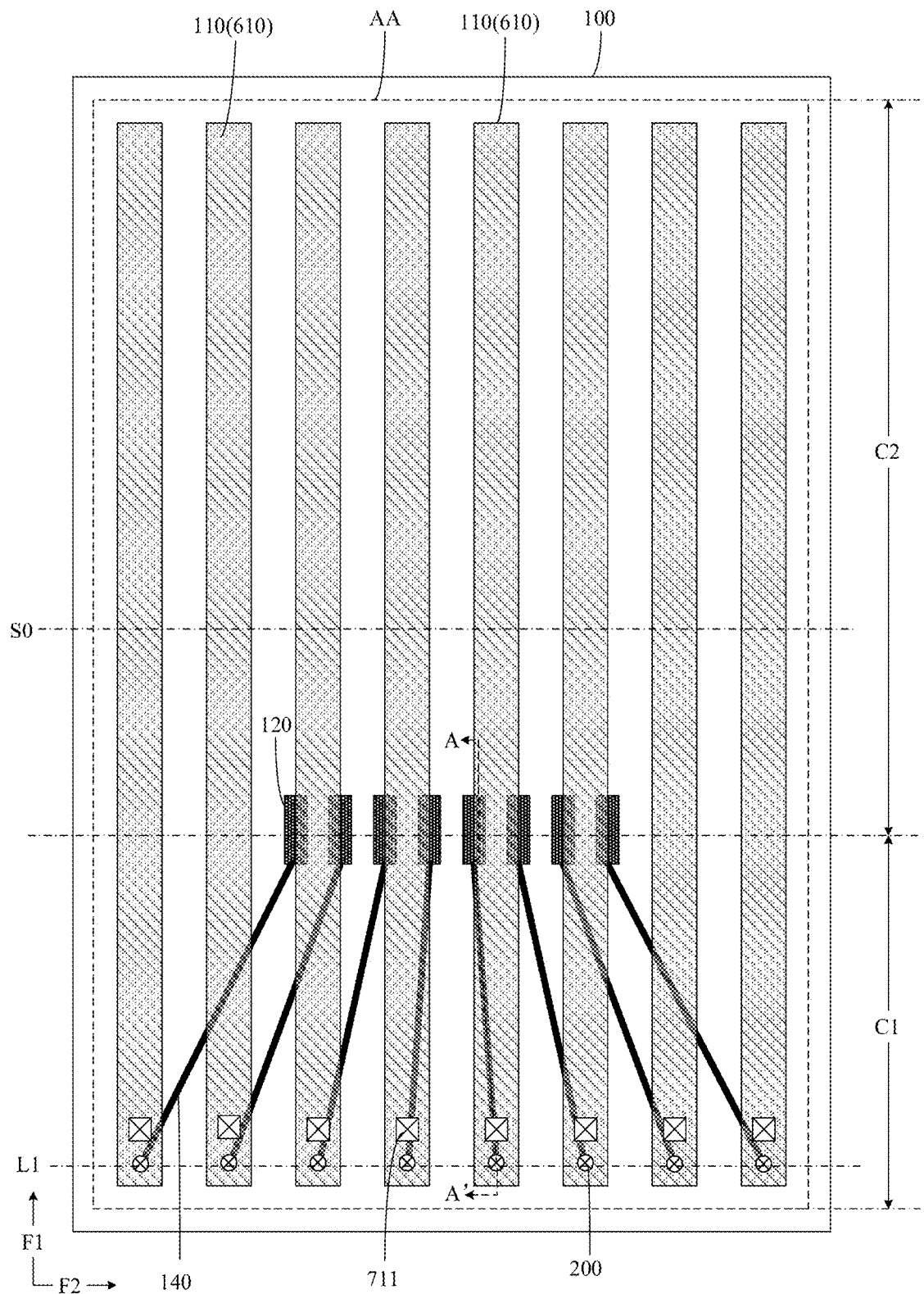
FIG. 6A is a schematic structural top view of another display panel according to an embodiment of the present disclosure.
Figure 7:
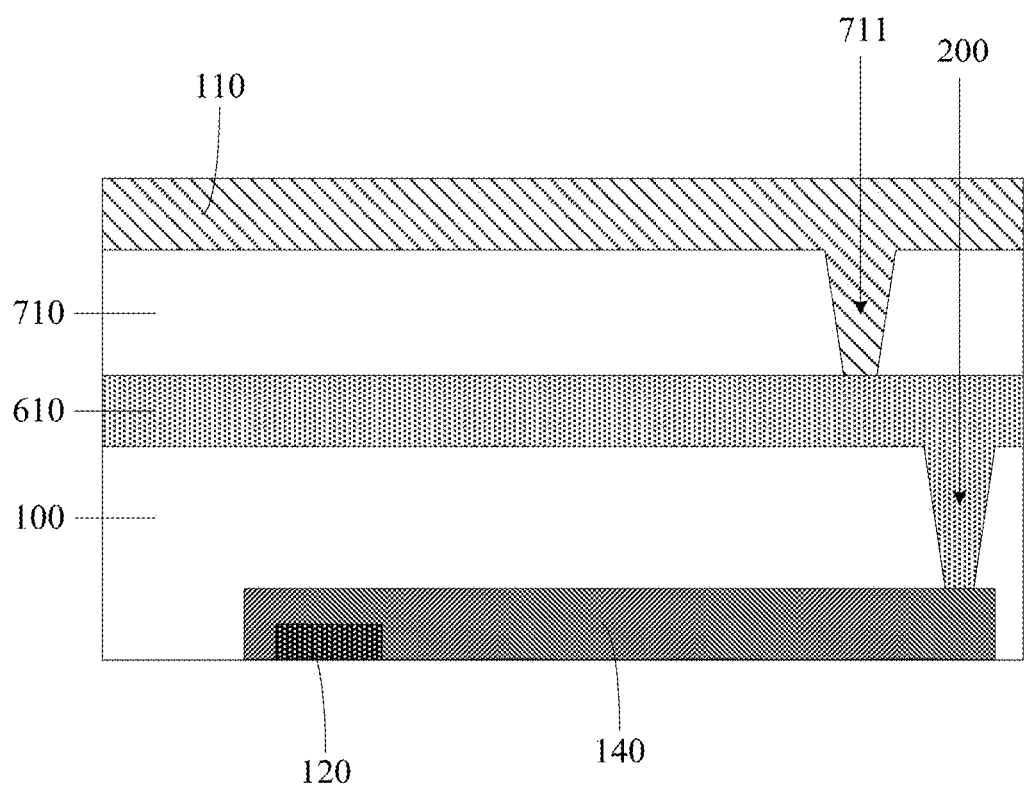
FIG. 7 is a schematic structural cross-sectional view of the display panel shown in FIG. 6A along direction AA'.

Further, in some implementations, in embodiments of the present disclosure, as shown in FIG. 6A and FIG. 7, the display area AA may further include: a first insulating layer 710 located between a layer where the driving signal lines 110 are located and the base substrate 100, and a plurality of first auxiliary lines 610 located between the first insulating layer 710 and the base substrate 100. The first insulating layer 710 may have a plurality of first via holes 711, one of the driving signal lines 110 is correspondingly electrically connected to one of the first auxiliary lines 610 through the first via hole 711, and one of the first auxiliary lines 610 is correspondingly electrically connected to at least one of the first fan-out lines 140 through the substrate via hole 200. It can be understood that when one of the driving signal lines 110 is correspondingly electrically connected to one of the first auxiliary lines 610 through one of the first via holes 711, the first auxiliary line 610 only serves to transfer an electrical signal. When one of the driving signal lines 110 is correspondingly electrically connected to one of the first auxiliary lines 610 through a plurality of first via holes 711, the driving signal line 110 and the first auxiliary line 610 form a parallel structure, so that a voltage drop generated when the electrical signal is transmitted on the driving signal line 110 can be reduced.

In some implementations, in embodiments of the present disclosure, as shown in FIG. 6A and FIG. 7, the driving signal lines 110 may extend along a first direction F1, and the driving signal lines 110 may be arranged along a second direction F2. The first direction F1 and the second direction F2 are different. For example, the first direction F1 is perpendicular to the second direction F2. Exemplarily, the first direction F1 may be a column direction of the sub-pixels, and the second direction F2 may be a row direction of the sub-pixels. Alternatively, the first direction F1 may be the row direction of the sub-pixels, and the second direction F2 may be the column direction of the sub-pixels, which is not limited herein.

Exemplarily, as shown in FIG. 6A and FIG. 7, the first auxiliary lines 610 may also extend along the first direction F1, and the first auxiliary lines 610 may be arranged along the second direction F2. In some implementations, orthographic projections of the driving signal line 110 and the first auxiliary line 610 corresponding to each other on the base substrate 100 may have an overlapping area. Further, the orthographic projection of the driving signal line 110 on the base substrate 100 may cover the orthographic projection of the first auxiliary line 610 on the base substrate 100. Exemplarily, the orthographic projections of the driving signal line 110 and the first auxiliary line 610 corresponding to each other on the base substrate 100 may overlap, which can further reduce influences of the first auxiliary line 610 to a display effect. In some embodiments, the extension length of the first auxiliary line 610 may also be smaller than the length of the corresponding driving signal line 110.

Exemplarily, as shown in FIG. 3 and FIG. 6A, the plurality of bonding terminals are spaced apart. For example, the bonding terminals 120 may be sequentially arranged along the second direction F2. Exemplarily, the bonding terminals 120 may be sequentially arranged on the same straight line along the second direction F2. Exemplarily, a space between the adjacent bonding terminals 120 may be substantially the same. In this way, the bonding terminals 120 can be designed uniformly, so that the bonding terminals 120 can be arranged uniformly.

Exemplarily, as shown in FIG. 6A, with an area where the bonding terminals 120 are located as a boundary, the display area AA may be divided into a first side C1 and a second side C2 relative to the bonding terminals 120; and the first side C1 and the second side C2 are arranged along the first direction F1. For example, each of the bonding terminals 120 has a center (such as a geometric center), in this way, with the line of centers of the plurality of bonding terminals 120 as a boundary, the display area AA is divided into a first side C1 and a second side C2 relative to the plurality of bonding terminals 120. In practical applications, other methods may also be used to set the above-mentioned boundary, which is not limited herein.

Exemplarily, as shown in FIG. 6A, one of the first auxiliary lines 610 may correspond to one of the first fan-out lines 140, and one of the first auxiliary lines 610 may correspond to one of the substrate via holes 200, so that one of the first auxiliary lines 610 may be correspondingly electrically connected to one of the first fan-out lines 140 through one of the substrate via holes 200.

Exemplarily, as shown in FIG. 6A, all the substrate via holes 200 may be located in the first side C1 of an area where the bonding terminals 120 are located. In practical applications, all the substrate via holes 200 may also be located in the second side C2 of the area where the bonding terminals 120 are located, which can be designed and determined according to a practical application environment and is not limited herein.

Figure 6B:
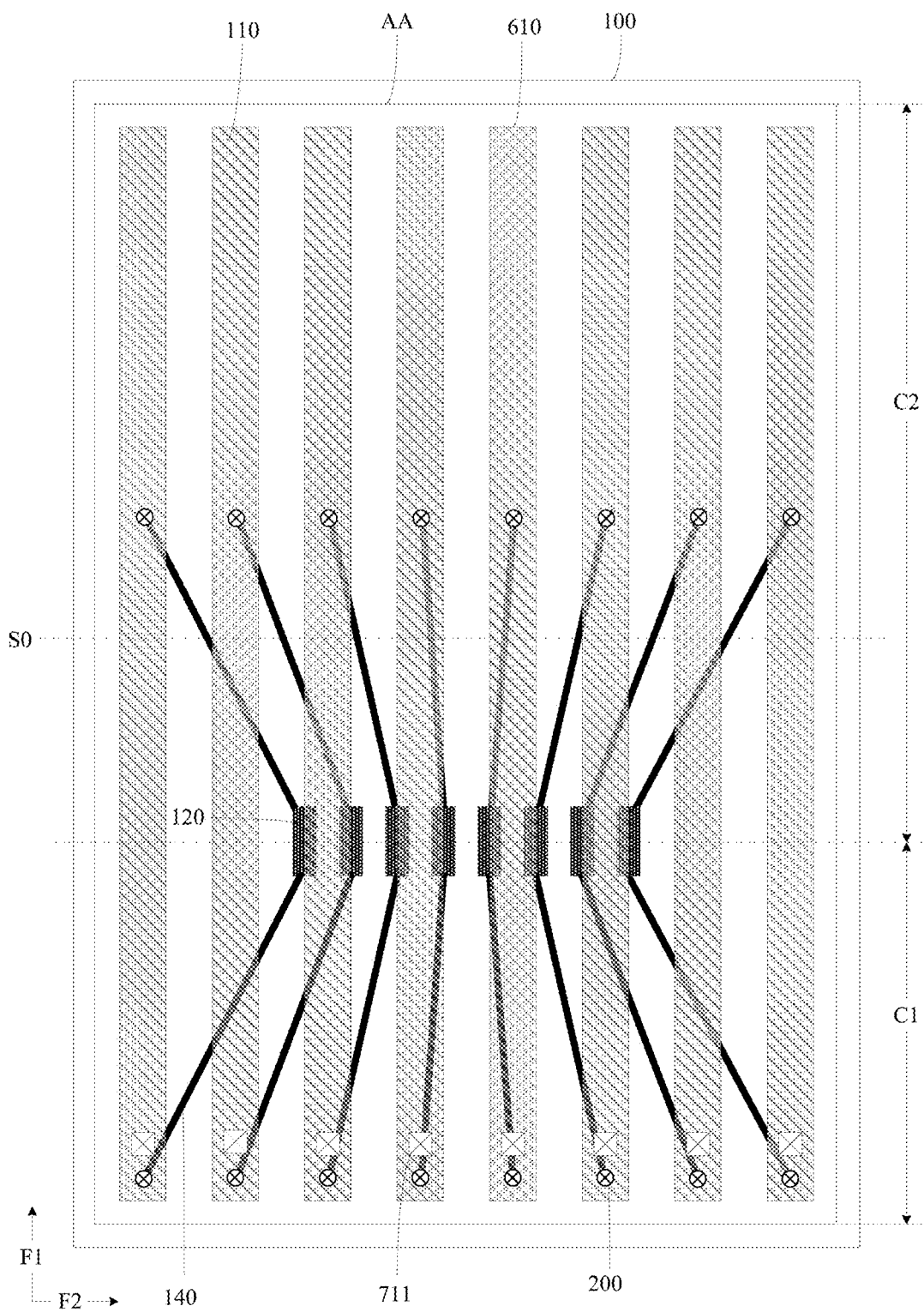
FIG. 6B is a schematic structural top view of another display panel according to an embodiment of the present disclosure.

Exemplarily, as shown in FIG. 6B, one of the first auxiliary lines 610 may correspond to two of the first fan-out lines 140, one of the first auxiliary lines 610 may correspond to two of the substrate via holes 200, and one of the first fan-out lines 140 may correspond to one of the substrate via holes 200, so that one of the first auxiliary lines 610 may be correspondingly electrically connected to two of the first fan-out lines 140 through the substrate via holes 200. One substrate via hole 200 corresponding to the same first auxiliary line 610 may be located in the first side C1 of the area where the bonding terminals 120 are located, and the other substrate via hole 200 corresponding to the same first auxiliary line 610 may be located in the second side C2 of the area where the bonding terminals 120 are located. In this way, the substrate via holes 200 corresponding to the same first auxiliary line 610 may be disposed dispersedly, and one of the bonding terminals 120 may be respectively electrically connected to different positions of the driving signal line 110 through two of the first fan-out lines 140, so that voltages on various positions of the driving signal line 110 are equipotential, and furthermore, the IR drop caused by the excessively long signal line can be relieved.

Further, an orthographic projection of the first via hole 711 on the base substrate 100 and an orthographic projection of the substrate via hole 200 on the base substrate 100 may not overlap. Generally, an etching process is used to prepare the via holes, and it is preferable that the orthographic projection of the first via hole 711 on the base substrate 100 and the orthographic projection of the substrate via hole 200 on the base substrate 100 at least partially do not overlap, and in some embodiments, may not overlap at all, thereby avoiding the formation of a deeper through hole which may affect the stability of subsequent electrical connections. Generally, a process step for preparing the substrate via holes 200 is earlier than a process step for preparing the first via holes 711, in this way, influences to the substrate via holes 200 can be avoided when the first via holes 711 are prepared by using an etching process.

Figure 8:
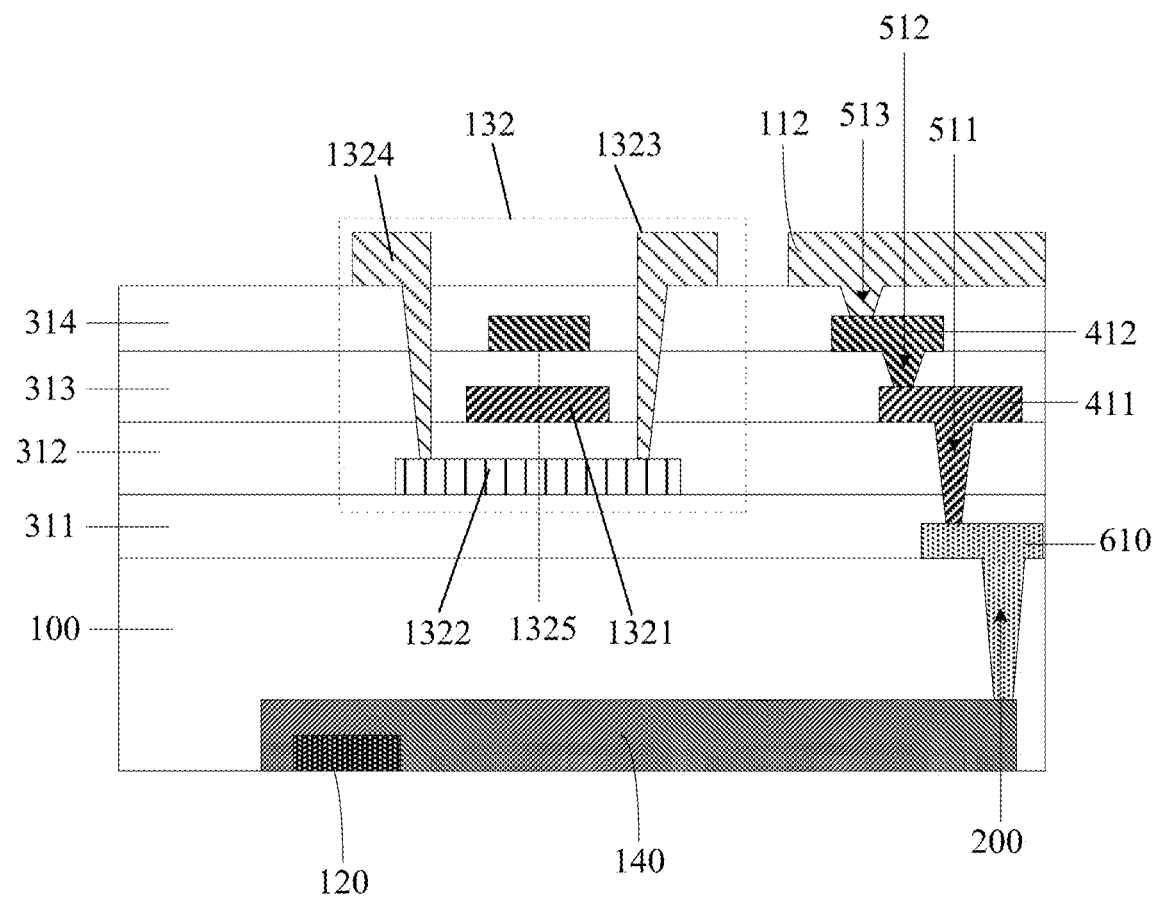
FIG. 8 is a schematic partial structural cross-sectional view of the display panel according to the embodiment of the present disclosure.

Exemplarily, an example in which the display panel is an electroluminescent display panel and the driving signal lines 110 are data lines is taken for description. As shown in FIG. 8, a transistor 132 in the pixel circuit may include: a gate 1321, an active layer 1322 insulated from the gate 1321, and a source 1323 and a drain 1324 that are insulated from the gate 1321 and electrically connected to the active layer 1322. Besides, a metal electrode 1325 insulated from both the source 1323 and the drain 1324 is further disposed between a layer where the source 1323 and the drain 1324 of the transistor 132 are located and a layer where the gate 1321 is located, an orthographic projection of the metal electrode 1325 on the base substrate 100 and an orthographic projection of the gate 1321 on the base substrate 100 have an overlapping area in which a storage capacitor in the pixel circuit is formed. A buffer layer 311 is disposed between the active layer 1322 and the base substrate 100, a gate insulating layer 312 is disposed between the layer where the gate 1321 is located and the active layer 1322, and an interlayer dielectric layer 313 is disposed between the layer where the gate 1321 is located and a layer where the metal electrode 1325 is located. An interlayer insulating layer 314 is disposed between the layer where the metal electrode 1325 is located and the layer where the source 1323 and the drain 1324 are located. In practical applications, the drain 1324 of the transistor is electrically connected to an anode of the electroluminescent diode through a via hole to provide a voltage to the anode, and a voltage is applied to a cathode of the electroluminescent diode through the second power line to make the electroluminescent diode emit light, so that the display panel achieves a display function.

In embodiments of the present disclosure, in the case that the base substrate 100 is made of a flexible material such as plastic or polyimide, when the display panel is fabricated, firstly, a rigid substrate 01 may be provided, and bonding terminals 120 and first fan-out lines 140 are sequentially prepared on the rigid substrate 01; next, a flexible material such as a solution including polyimide is coated to form a PI substrate 100; and then, first auxiliary lines 610, buffer layers 311, active layers 1322, gate insulating layers 312, gates 1321, gate lines, interlayer dielectric layers 313, metal electrodes 1325, interlayer insulating layers 314, sources 1323, drains 1324, driving signal lines 110 and the like are prepared. Embodiments of the present disclosure are only described by taking the preparation method described above as an example. The display panel mentioned above in the present disclosure may also be prepared by using other preparation methods.

Exemplarily, as shown in FIG. 5 and FIG. 8, the gate line 111 may be disposed on the same layer and made of the same material as the gate 1321. In this way, the gate 1321 and the gate line 111 may be formed by using the same patterning process, thereby lowering the process preparation difficulty.

Exemplarily, as shown in FIG. 5 and FIG. 8, the data line 112 may be disposed on the same layer and made of the same material as the source 1323 and the drain 1324. In this way, the data line 112, the source 1323 and the drain 1324 may be formed by using the same patterning process, thereby lowering the process preparation difficulty. Further, at least one of the first power line and the second power line may also be disposed on the same layer and made of the same material as the data line.

Exemplarily, as shown in FIG. 8, the first insulating layer 710 may include a buffer layer 311, a gate insulating layer 312, an interlayer dielectric layer 313 and an interlayer insulating layer 314. Further, the display area AA may further include: a plurality of first connecting portions 411 and a plurality of second connecting portions 412. The first connecting portions 411 are located between the gate insulating layer 312 and the interlayer dielectric layer 313, and the second connecting portions 412 are located between the interlayer dielectric layer 313 and the interlayer insulating layer 314. One of the data lines 112 corresponds to at least one of the first connecting portions 411, at least one of the second connecting portions 412 and one of the first auxiliary lines 610. Besides, the data line 112 is electrically connected to the second connecting portion 412 through a via hole 513 penetrating through the interlayer insulating layer 314, the second connecting portion 412 is electrically connected to the first connecting portion 411 through a via hole 512 penetrating through the interlayer dielectric layer 313, the first connecting portion 411 is electrically connected to the first auxiliary line 610 through a via hole 511 penetrating through the gate insulating layer 312 and the buffer layer 311, and the first auxiliary line 610 is electrically connected to the first fan-out line 140 through the substrate via hole 200. In this way, the data line 112 and the first fan-out line 140 can be electrically connected. Thus, the data line 112 can be electrically connected to the first auxiliary line 610 sequentially through the second connecting portion 412 and the first connecting portion 411. If the first connecting portion 411 and the second connecting portion 412 are not disposed, a via hole needs to be disposed in the first insulating layer 710. Since the first insulating layer 710 is thicker, the via hole of the first insulating layer 710 is deeper, which may cause the problem that the data line and the first auxiliary line 610 cannot be electrically connected.

Exemplarily, the first via holes 711 may include: via holes 511, via holes 512 and via holes 513. Besides, an orthographic projection of the via hole 511 on the base substrate 100 and an orthographic projection of the via hole 512 on the base substrate 100 do not overlap, and the orthographic projection of the via hole 512 on the base substrate 100 and an orthographic projection of the via hole 513 on the base substrate 100 do not overlap. The orthographic projection of the via hole 511 on the base substrate 100 and the orthographic projection of the substrate via hole 200 on the base substrate 100 do not overlap. Thus, the data line 112 can be electrically connected to the first auxiliary line 610 sequentially through the second connecting portion 412 and the first connecting portion 411. If the first connecting portion 411 and the second connecting portion 412 are not disposed, a via hole needs to be disposed in the first insulating layer 710. Since the first insulating layer 710 is thicker, the via hole of the first insulating layer 710 is deeper, which may cause the problem that the data line and the first auxiliary line 610 cannot be electrically connected.

Exemplarily, as shown in FIG. 6A, one of the data lines may correspond to one of the first via holes 711, and then one of the data lines may correspond to one of the first connecting portions 411, one of the second connecting portions 412 and one of the first auxiliary lines 610. In this way, the fewer via holes can be disposed, and the stability of the display panel can be improved.

Exemplarily, as shown in FIG. 6A, the display area AA may have a symmetry axis S0 along the second direction F2. That is, the display area AA may be substantially axisymmetric about the symmetry axis S0. Besides, the substrate via holes 200 may be located in an area from the symmetry axis S0 to an edge of the display area AA.

Exemplarily, as shown in FIG. 6A, all the substrate via holes 200 may be arranged on a straight line L1 along the second direction F2. In this way, the design difficulty of the substrate via holes 200 can be lowered. Exemplarily, the straight line L1 may be parallel to the symmetry axis S0.

Exemplarily, as shown in FIG. 6A, all the substrate via holes 200 may be located in the same side of the symmetry axis S0 and close to the edge of the display area AA. In practical applications, a conventional process requires that a distance from the bonding terminal 120 to the edge of the display panel does not exceed an effective movement range of a base station pressure head of a bonding facility (for example, within 17 mm). By arranging all the substrate via holes 200 close to the edge of the display area AA, the operation of bonding the flexible circuit board can be performed by using the bonding facility in the conventional process, so that there is no need to additionally design a bonding manner.

It should be noted that, due to the limitation of process conditions or other factors, the same in the above-mentioned features may not be completely the same, and there may be a deviation. Therefore, the same relationship among the above-mentioned features all belongs to the protection scope of the present disclosure as long as it substantially satisfies the above-mentioned conditions. For example, the same mentioned above may be the same as allowed within an allowable error range.

Besides, due to the limitation of process conditions or other factors, the above-mentioned different via holes cannot be arranged completely on a straight line L1 along the second direction F2, and there may be a deviation. Therefore, the above-mentioned relationship of being arranged on a straight line L1 all belongs to the protection scope of the present disclosure as long as it substantially satisfies the above-mentioned conditions.

Figure 9:
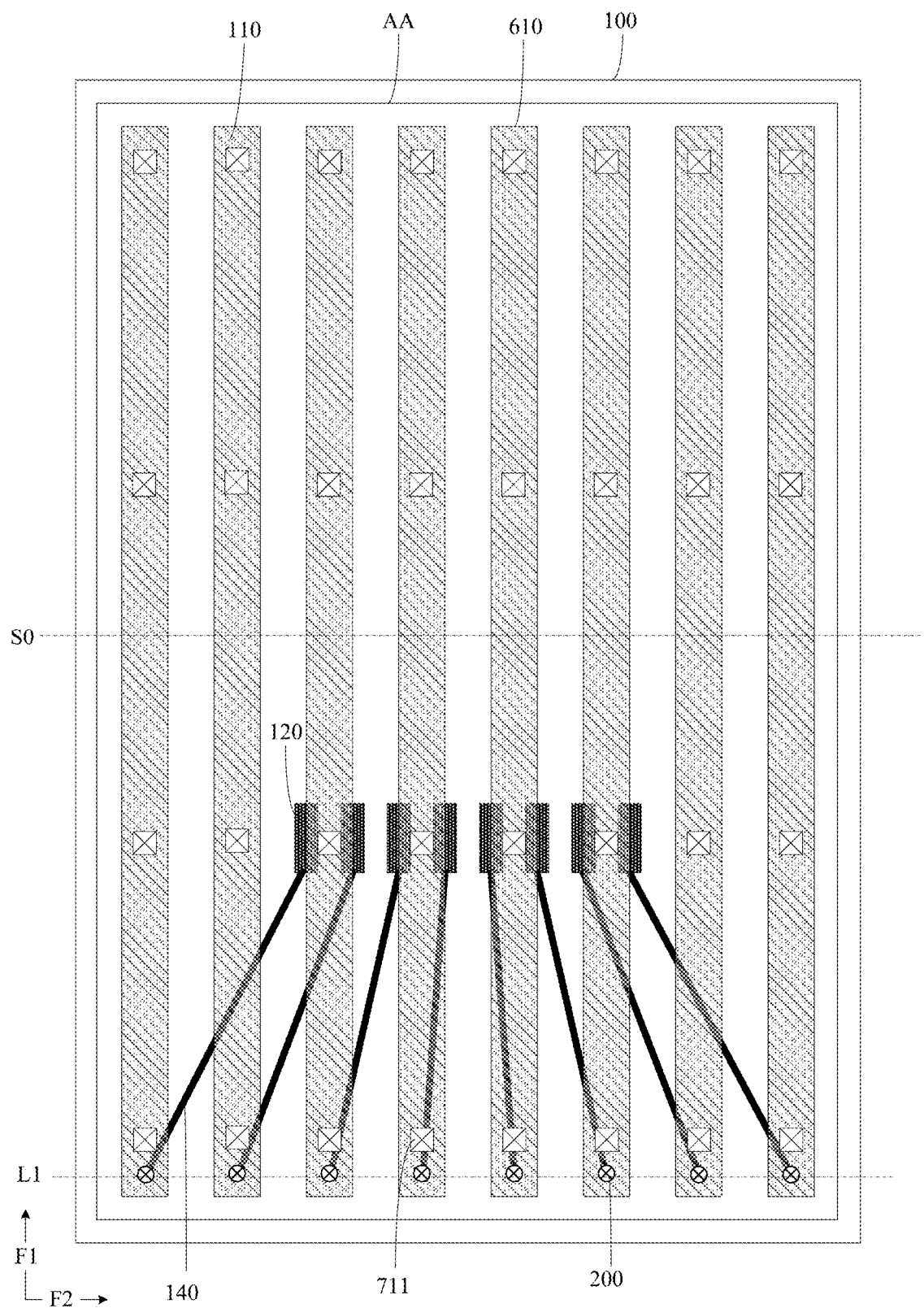
FIG. 9 is a schematic structural top view of another display panel according to an embodiment of the present disclosure.

Embodiments of the present disclosure further provide a display panel whose schematic structural view is shown in FIG. 9, which is a modification of the implementation manner in the above-mentioned embodiments. The following only describes differences of the embodiments and the above-mentioned embodiments, and similarities thereof are not repeated herein.

In some implementations, in embodiments of the present disclosure, as shown in FIG. 9, the driving signal line 110 and the first auxiliary line 610 corresponding to each other may be electrically connected through a plurality of spaced first via holes 711. In this way, one of the driving signal lines 110 and one of the first auxiliary lines 610 may be electrically connected through a plurality of spaced first via holes 711, and therefore, in the case that the driving signal line 110 and the first auxiliary line 610 cannot be electrically connected by using a part of the first via holes 711, the electrical connection can still be realized by using the remaining first via holes 711.

Exemplarily, there may be two, four or more first via holes 711 disposed, which can be designed and determined according to an actual application environment and is not limited herein. Thus, the driving signal line 110 and the first auxiliary line 610 are in a parallel connection equivalently, so that the resistance of the driving signal line 110 can be reduced, and furthermore, the signal transmission rate is increased.

Exemplarily, in some implementations, in embodiments of the present disclosure, as shown in FIG. 9, for the first via holes 711 corresponding to the same driving signal line 110, a space between every adjacent two of the first via holes 711 may be the same. In this way, the first via holes 711 can be designed uniformly, thereby further improving the stability of the display panel.

Exemplarily, in some implementation, in embodiments of the present disclosure, as shown in FIG. 9, the first via holes 711 corresponding to every two adjacent driving signal lines 110 may be arranged on a straight line L1 along the second direction F2, thereby further improving the stability of the display panel.

Exemplarily, in some implementation, in embodiments of the present disclosure, the first via holes 711 corresponding to every two adjacent driving signal lines 110 may also be arranged in a staggered manner. In this way, the first via holes 711 can be designed uniformly and dispersedly, thereby further improving the stability of the display panel.

Figure 10:
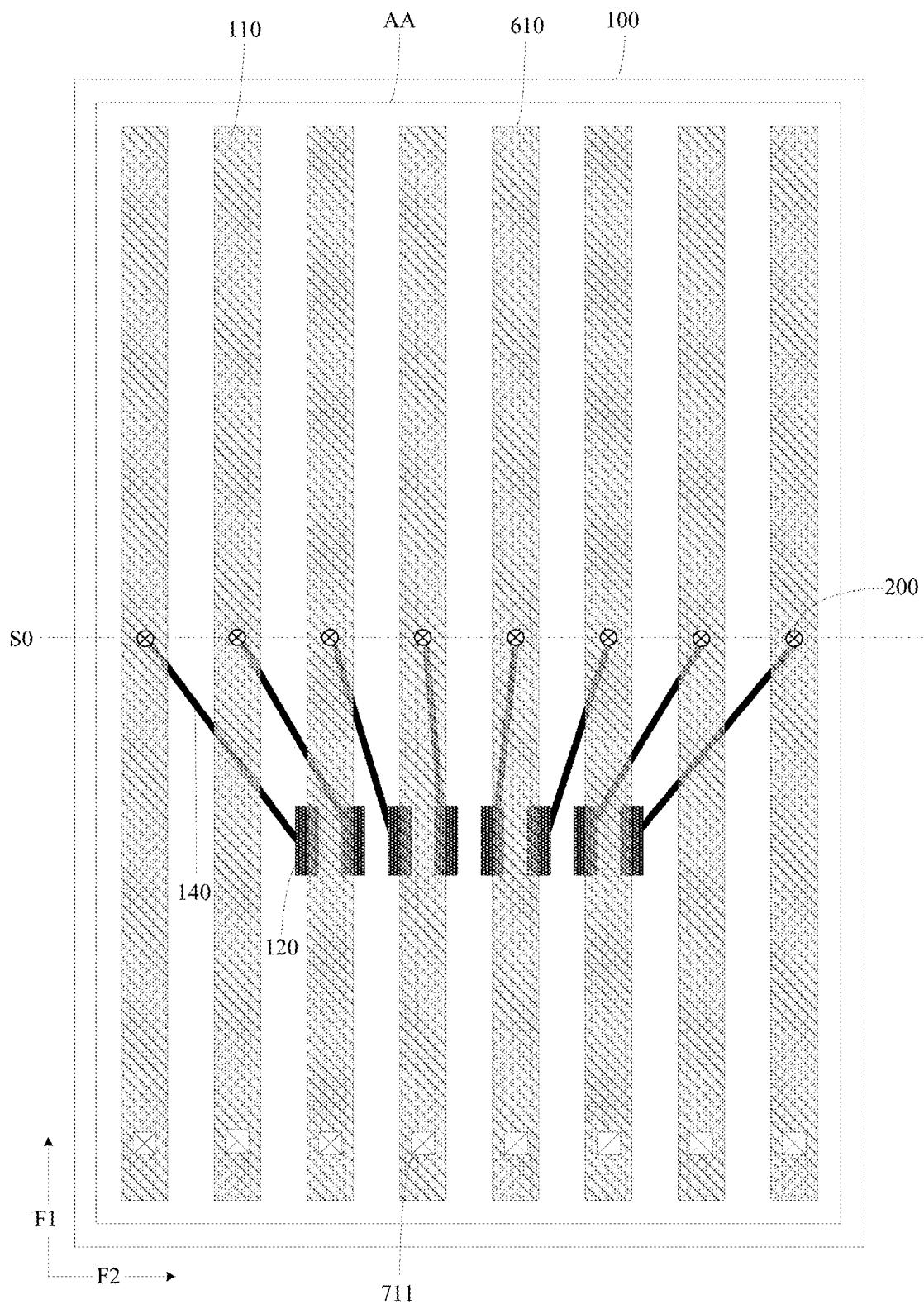
FIG. 10 is a schematic structural top view of another display panel according to an embodiment of the present disclosure.

Embodiments of the present disclosure further provide a display panel whose schematic structural view is shown in FIG. 10, which is a modification of the implementation manner in the above-mentioned embodiments. The following only describes differences of the embodiments and the above-mentioned embodiments, and similarities thereof are not repeated herein.

Exemplarily, one of the driving signal lines 110 may correspond to one of the substrate via holes 200. In some implementations, in embodiments of the present disclosure, as shown in FIG. 10, all the substrate via holes 200 may be located in the symmetry axis S0. Since the base substrate 100 needs to be cut (for example, by laser or a cutter wheel) during the preparation of the display panel, thermal or stress effects will be generated on the via holes during the cutting, resulting in poor substrate via holes 200, and further resulting in the problem of poor electrical connections among the signal lines. According to the present disclosure, by disposing the substrate via holes 200 in the symmetry axis S0, the substrate via holes 200 can be located in the middle row of the display area AA, which can avoid effects caused by the cutting.

Besides, since the substrate via holes 200 are disposed in the symmetry axis S0, the first auxiliary line 610 is equivalent to a pattern also substantially symmetrical about the symmetry axis S0, which is equivalent to reducing the resistance of a signal transmitted by the first fan-out line 140 across the first auxiliary line 610 by half, thereby effectively reducing the IR Drop and enhancing the display uniformity.

Figure 11:
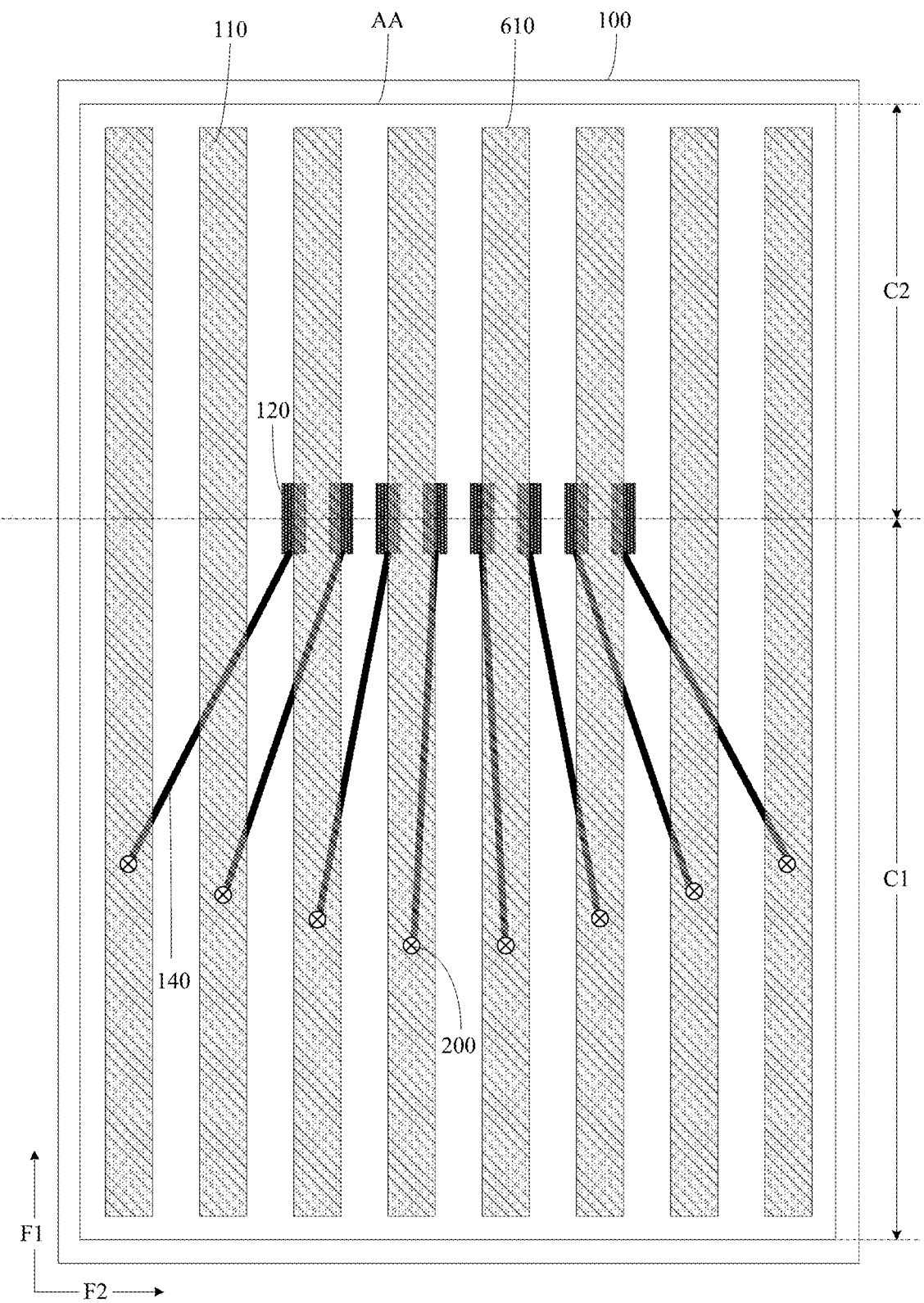
FIG. 11 is a schematic structural top view of another display panel according to an embodiment of the present disclosure.
Figure 12:
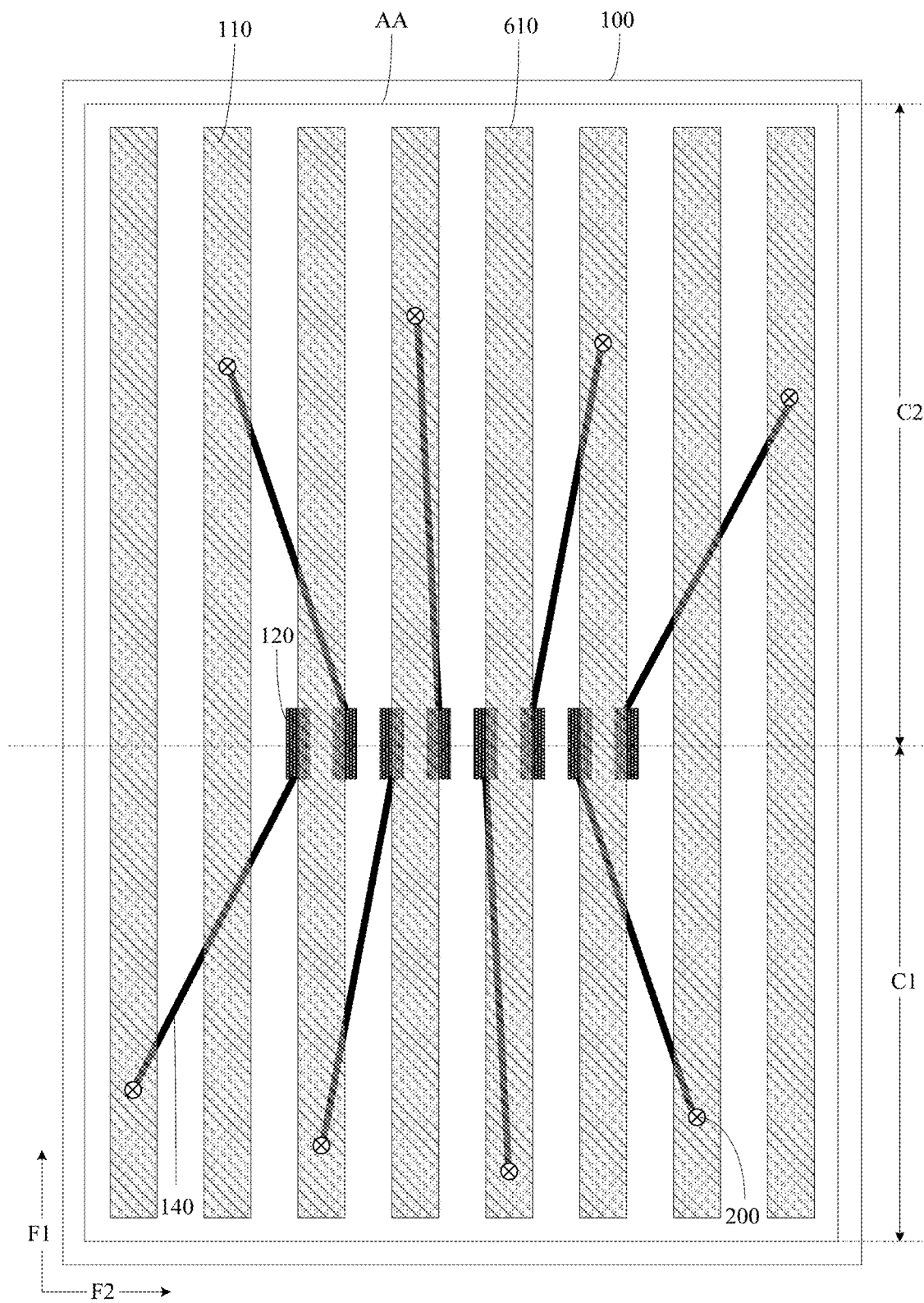
FIG. 12 is a schematic structural top view of another display panel according to an embodiment of the present disclosure.

Embodiments of the present disclosure further provide a display panel whose schematic structural views are shown in FIG. 11 and FIG. 12, which is a modification of the implementation manner in the above-mentioned embodiments. The following only describes differences of the embodiments and the above-mentioned embodiments, and similarities thereof are not repeated herein.

In some implementations, in embodiments of the present disclosure, as shown in FIG. 11 and FIG. 12, a distance from an orthographic projection of each of the bonding terminals 120 on the base substrate 100 to an orthographic projection of the corresponding substrate via hole 200 on the base substrate 100 may be substantially the same. Considering a difference in resistances of the first fan-out lines 140, by making the substrate via holes 200 in a staggered manner, the substrate via hole 200 corresponding to the longer first fan-out line 140 is close to a sub-pixel row corresponding to the area where the bonding terminals 120 are located, and the substrate via hole 200 corresponding to the shorter first fan-out line 140 is far away from the sub-pixel row corresponding to the area where the bonding terminals 120 are located, so that signals input by the bonding terminals 120 can be transmitted to each of the driving signal lines 110 through the first fan-out lines 140 with the substantially same resistances, and thus, voltages transmitted to the driving signal lines 110 are substantially the same, thereby improving the display uniformity.

In some implementations, in embodiments of the present disclosure, as shown in FIG. 11 and FIG. 12, the area where the bonding terminals 120 are located may have a first side C1 and a second side C2 opposite to each other; and the first side C1 and the second side C2 are arranged along the first direction F1. The plurality of substrate via holes 200 may be located in at least one side in the first side C1 and the second side C2. Exemplarily, as shown in FIG. 11, all the substrate via holes 200 may be located in the first side C1. In this way, the above-mentioned substrate via holes 200 may be disposed uniformly.

Exemplarily, in some implementations, in embodiments of the present disclosure, as shown in FIG. 12, a part of the substrate via holes 200 in the plurality of substrate via holes 200 may be located in the first side C1, and the remaining part of the substrate via holes 200 in the plurality of substrate via holes 200 may be located in the second side C2. In this way, the substrate via holes 200 may be further dispersed, thereby further improving the stability of the display panel.

Exemplarily, in some implementations, in embodiments of the present disclosure, as shown in FIG. 12, the substrate via holes 200 corresponding to the odd-numbered first fan-out lines 140 along the second direction F2 are located in the first side C1, and the substrate via holes 200 corresponding to the even-numbered first fan-out lines 140 are located in the second side C2. In this way, the distance between the substrate via holes 200 corresponding to the adjacent first fan-out lines 140 can be further increased, thereby further improving the stability of the display panel.

Figure 13:
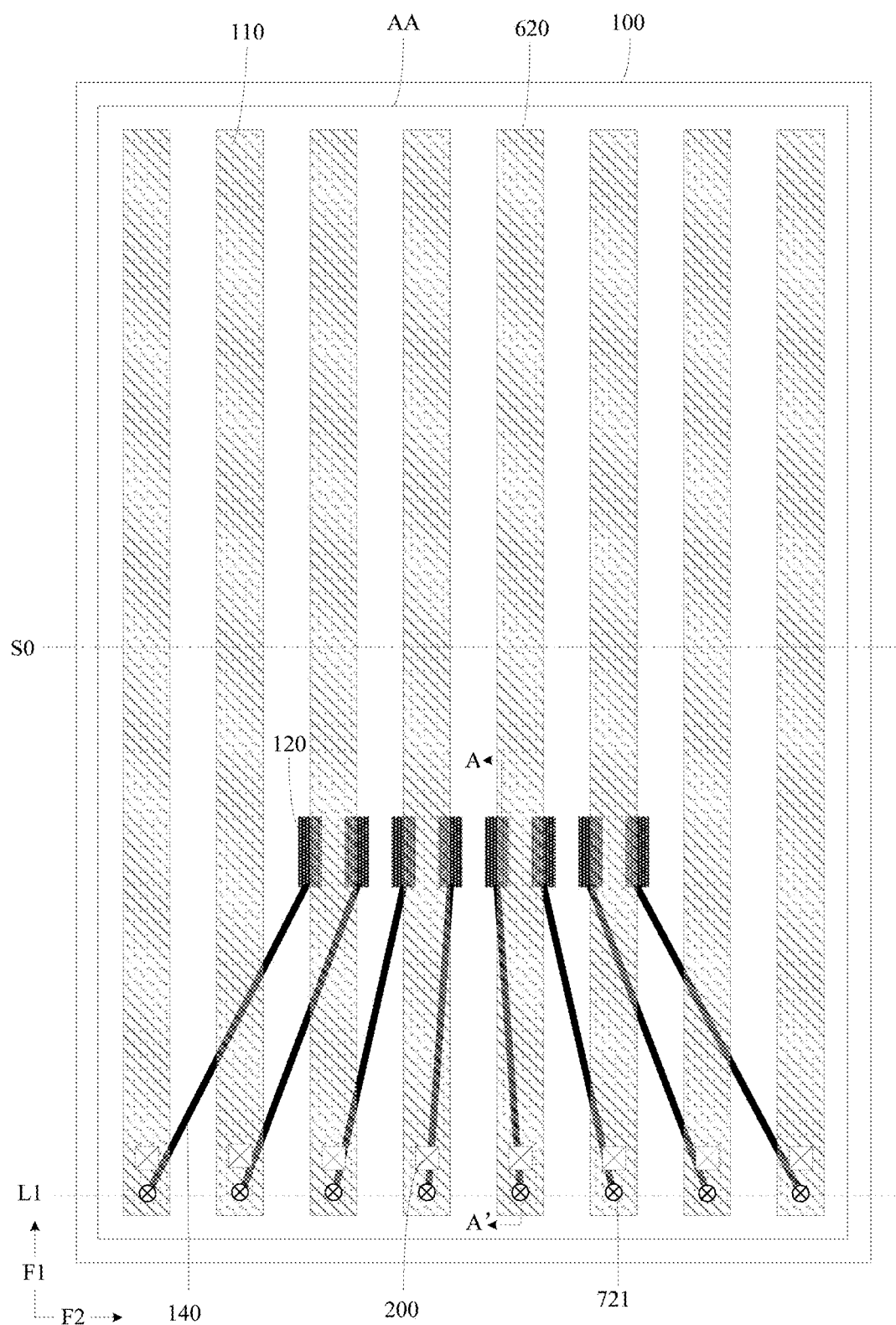
FIG. 13 is a schematic structural top view of another display panel according to an embodiment of the present disclosure.
Figure 16:
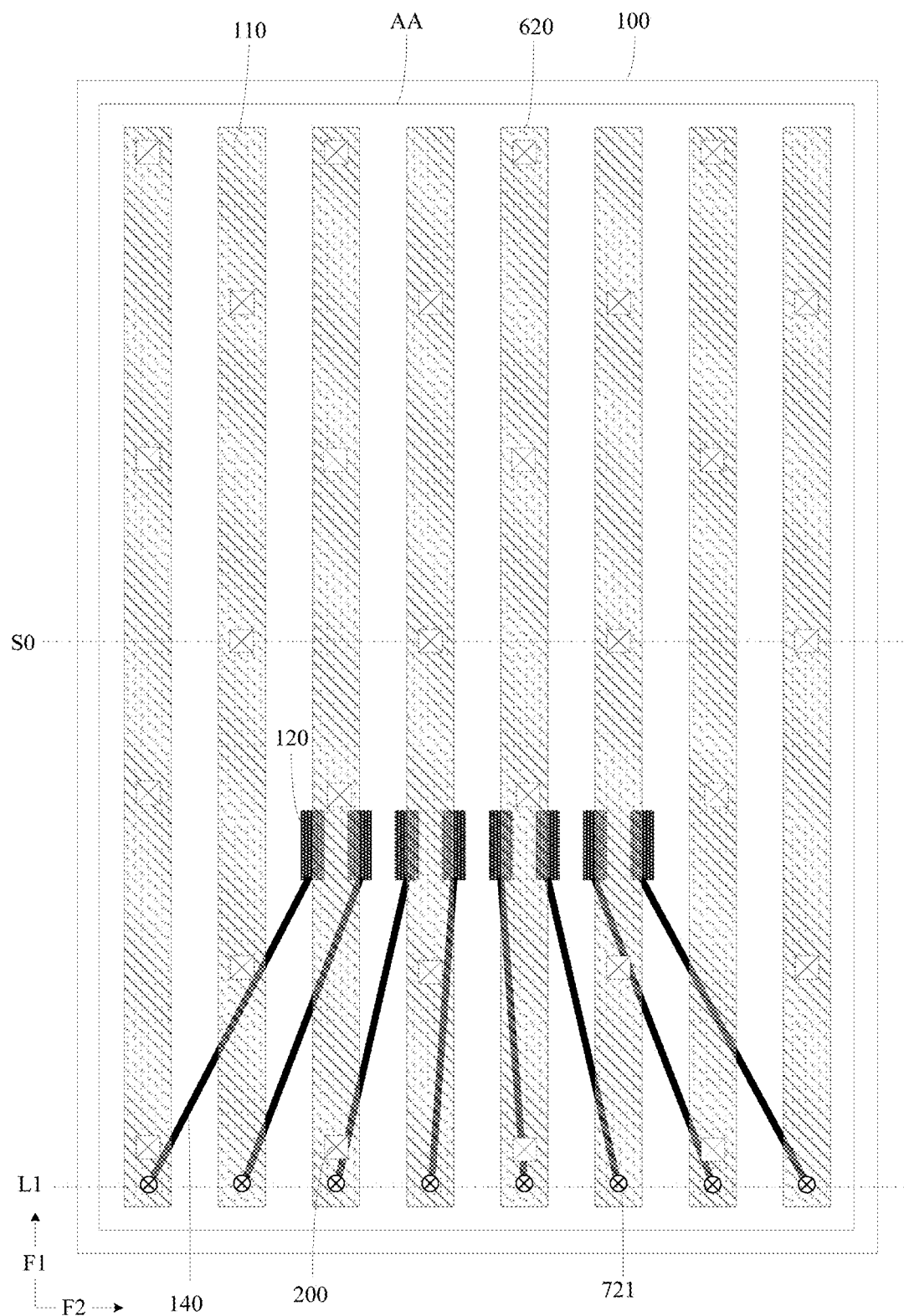
FIG. 16 is a schematic structural top view of another display panel according to an embodiment of the present disclosure.

Embodiments of the present disclosure further provide a display panel whose schematic structural views are shown in FIG. 13 and FIG. 16, which is a modification of the implementation manner in the above-mentioned embodiments. The following only describes differences of the embodiments and the above-mentioned embodiments, and similarities thereof are not repeated herein.

Figure 14:
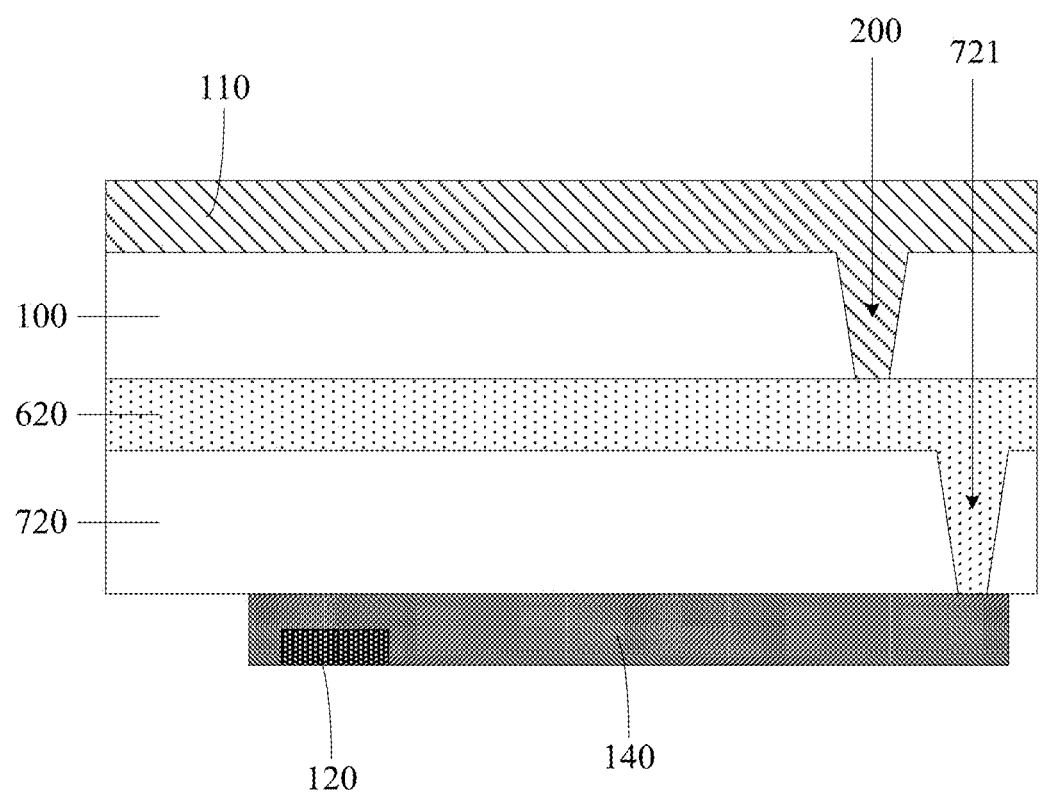
FIG. 14 is a schematic structural cross-sectional view of the display panel shown in FIG. 13 along direction AA'.

In some implementations, in embodiments of the present disclosure, as shown in FIG. 13 and FIG. 14, the display panel may further include: a second insulating layer 720 located between a layer where the first fan-out lines 140 are located and the base substrate 100, and a plurality of second auxiliary lines 620 located between the second insulating layer 720 and the base substrate 100. The second insulating layer 720 has a plurality of second via holes 721, one of the driving signal lines 110 is correspondingly electrically connected to one of the second auxiliary lines 620 through the substrate via hole 200, and one of the second auxiliary lines 620 is correspondingly electrically connected to one of the first fan-out lines 140 through the second via hole 721.

Figure 15:
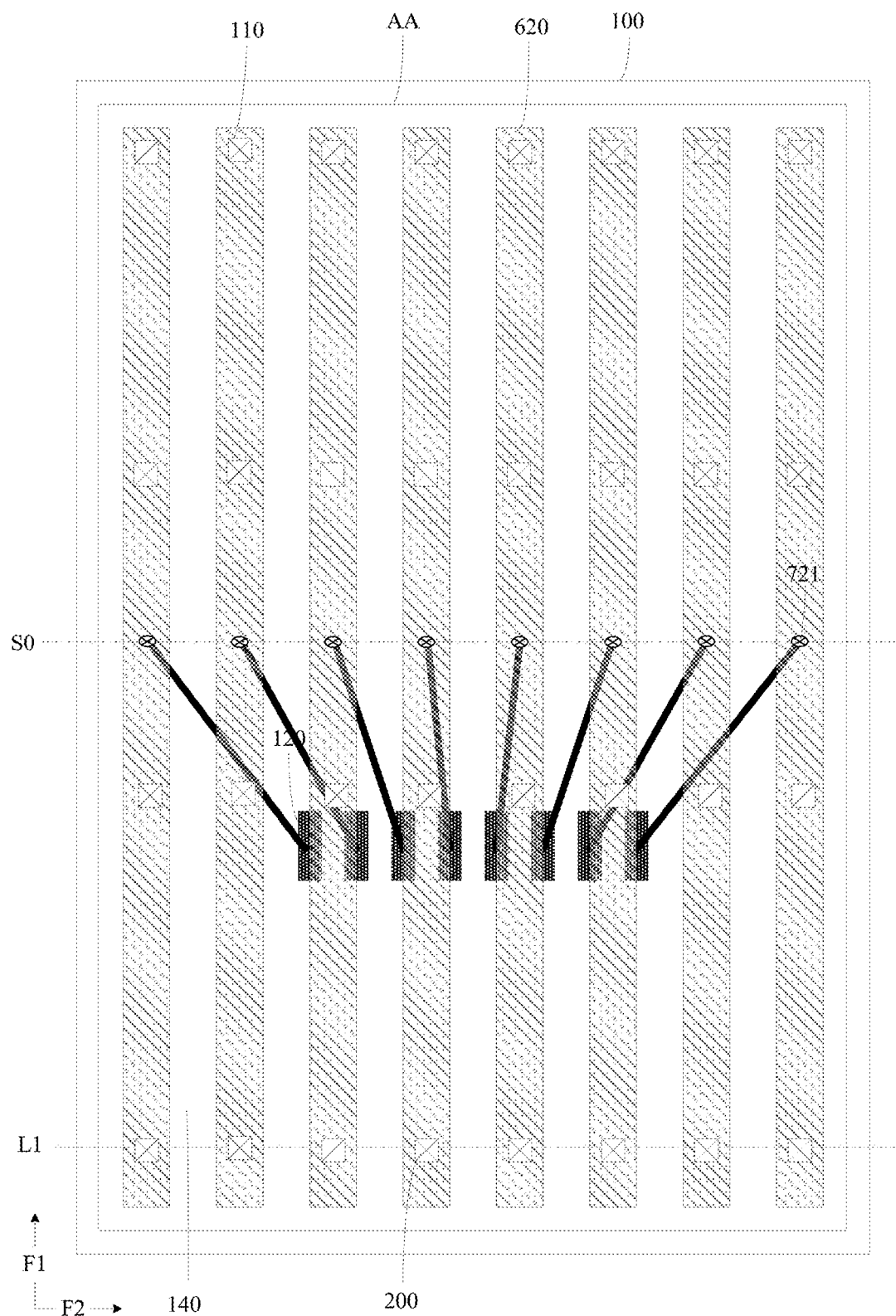
FIG. 15 is a schematic structural top view of another display panel according to an embodiment of the present disclosure.

In some implementations, in embodiments of the present disclosure, as shown in FIG. 13 and FIG. 15, orthographic projections of the driving signal line 110 and the second auxiliary line 620 corresponding to each other on the base substrate 100 overlap. In this way, influences of the second auxiliary lines to a display effect can be reduced, and the display effect can be improved.

Exemplarily, in some implementations, in embodiments of the present disclosure, as shown in FIG. 13, one of the second auxiliary lines 620 may correspond to one of the driving signal lines 110, and one of the second auxiliary lines 620 may correspond to one of the substrate via holes 200, so that the driving signal line 110 and the second auxiliary line 620 corresponding to each other can be electrically connected through one of the substrate via holes 200. In this way, the fewer substrate via holes 200 can be disposed, and the stability of the display panel can be improved.

Exemplarily, in some implementations, in embodiments of the present disclosure, as shown in FIG. 15, one of the second auxiliary lines 620 may correspond to one of the driving signal lines 110, and one of the second auxiliary lines 620 may correspond to a plurality of substrate via holes 200, so that the driving signal line 110 and the second auxiliary line 620 corresponding to each other can be electrically connected through the plurality of spaced substrate via holes 200. In this way, one of the driving signal lines 110 and one of the second auxiliary lines 620 may be electrically connected through a plurality of spaced substrate via holes 200, and therefore, in the case that the driving signal line 110 and the second auxiliary line 620 cannot be electrically connected by using a part of the substrate via holes 200, the electrical connection can still be realized by using the remaining substrate via holes 200. Besides, the driving signal line 110 and the second auxiliary line 620 can be in a parallel connection equivalently, thereby reducing the resistance of the driving signal line 110 and further improving the signal transmission rate.

Exemplarily, there may be two, four or more substrate via holes 200 disposed, which can be designed and determined according to an actual application environment and is not limited herein.

Exemplarily, in some implementations, in embodiments of the present disclosure, as shown in FIG. 15, for the substrate via holes 200 corresponding to the same driving signal line 110, a space between every adjacent two of the substrate via holes 200 may be the same. In this way, the substrate via holes 200 can be designed uniformly, thereby further improving the stability of the display panel.

Exemplarily, in some implementations, in embodiments of the present disclosure, as shown in FIG. 15, the substrate via holes 200 corresponding to every two adjacent driving signal lines 110 may be arranged on a straight line L1 along the second direction F2. In this way, the substrate via holes 200 can be designed uniformly, thereby further improving the stability of the display panel.

Exemplarily, in some implementations, in embodiments of the present disclosure, as shown in FIG. 16, the substrate via holes 200 corresponding to every two adjacent driving signal lines 110 may also be arranged in a staggered manner. Exemplarily, with the substrate via holes 200 corresponding to the adjacent two driving signal lines 110 as an example, a via hole of one of the driving signal lines 110 corresponds to a gap formed between the via holes of the other driving signal lines. In this way, the substrate via holes 200 can be further disposed uniformly and dispersedly, thereby further improving the stability of the display panel.

Exemplarily, one of the driving signal lines 110 may correspond to one of the second via holes 721. In some implementations, in embodiments of the present disclosure, as shown in FIG. 15, all the second via holes 721 may be located in the symmetry axis S0. Since the base substrate 100 needs to be cut (for example, by laser or a cutter wheel) during the preparation of the display panel, thermal or stress effects will be generated on the via holes during the cutting, resulting in poor second via holes 721, and further resulting in the problem of poor electrical connections among the signal lines. According to the present disclosure, by disposing the second via holes 721 in the symmetry axis S0, the second via holes 721 can be located in the middle row of the display area AA, which can avoid effects caused by the cutting.

Besides, since the second via holes 721 are disposed in the symmetry axis S0, the second auxiliary line 620 is equivalent to a pattern also substantially symmetrical about the symmetry axis S0, which is equivalent to reducing the resistance of a signal transmitted by the second fan-out line 150 across the second auxiliary line 620 by half, thereby effectively reducing the IR Drop and enhancing the display uniformity.

Figure 17:
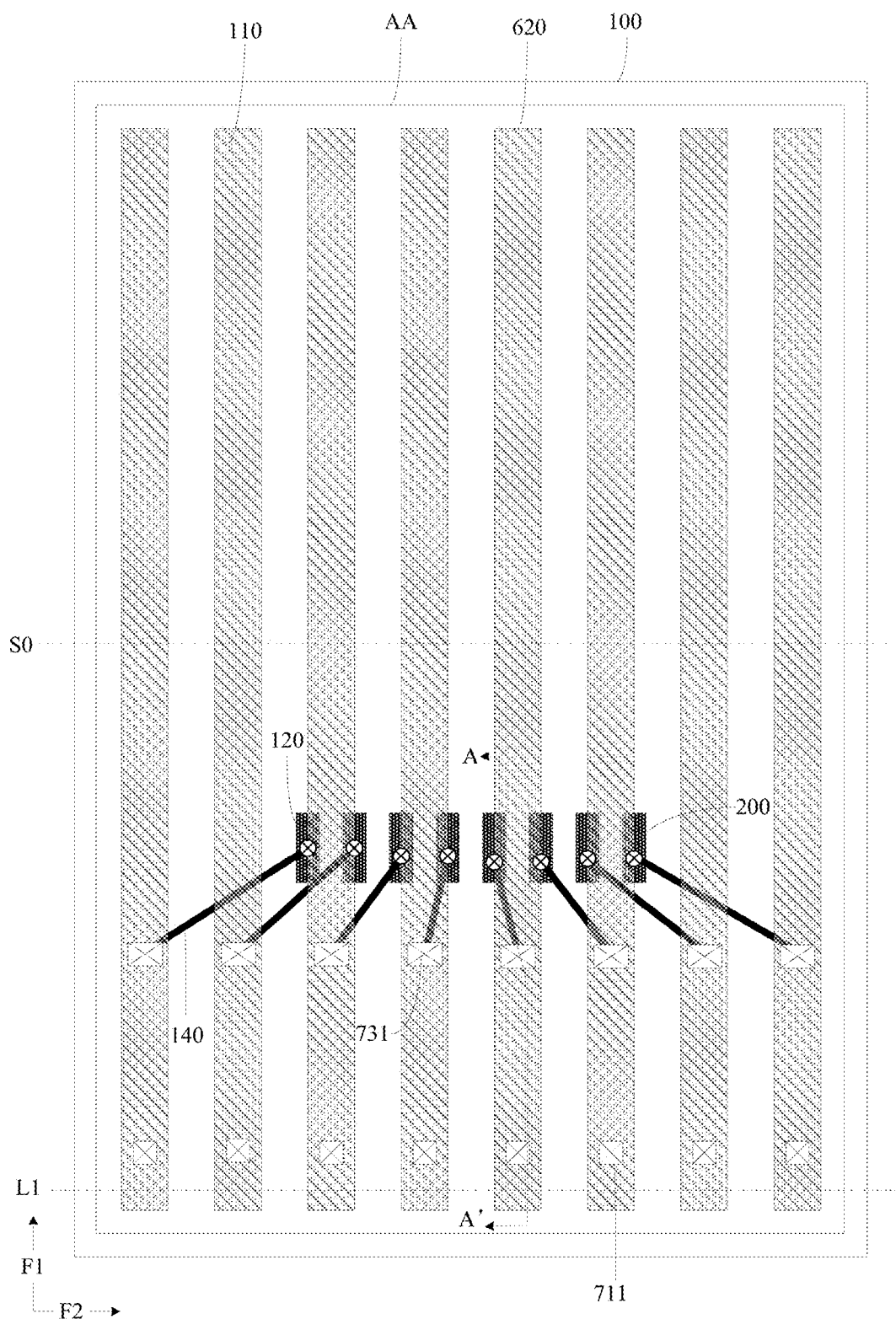
FIG. 17 is a schematic structural top view of another display panel according to an embodiment of the present disclosure.
Figure 18:
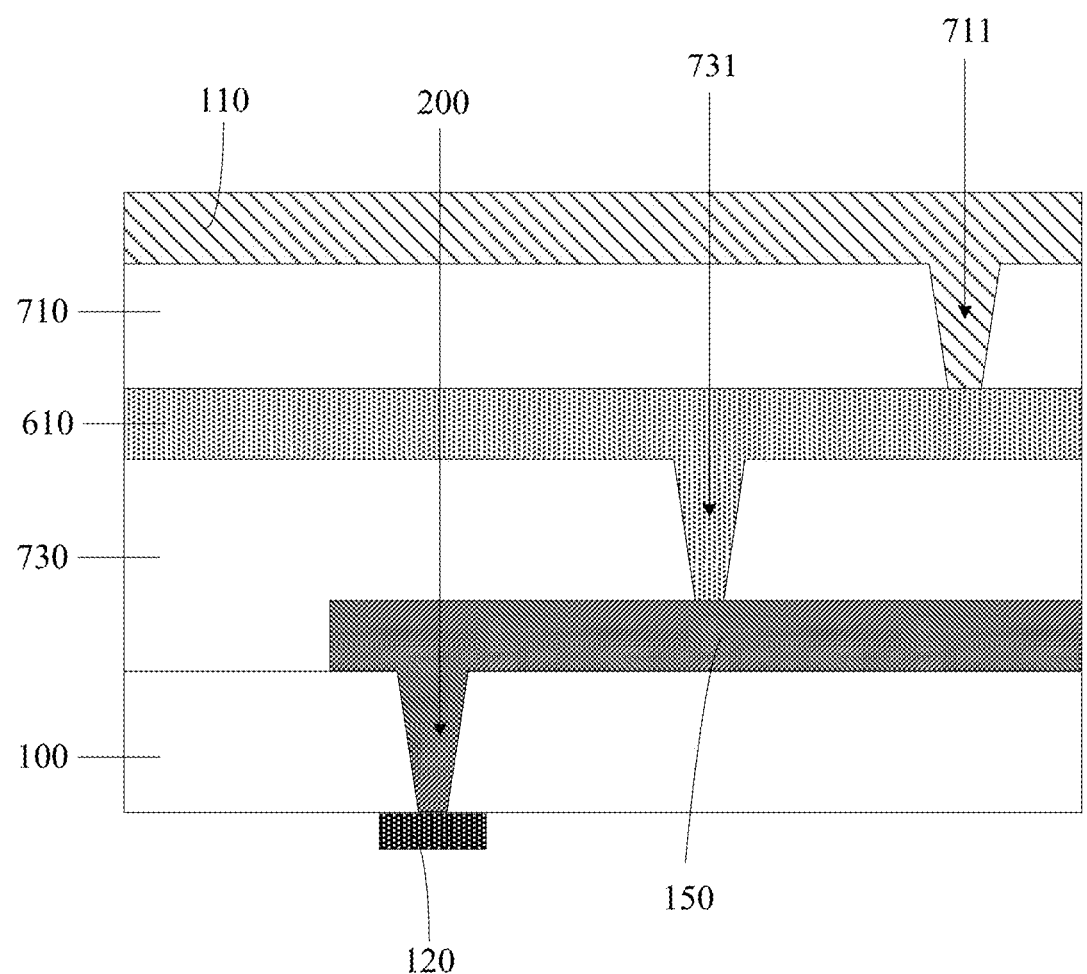
FIG. 18 is a schematic structural cross-sectional view of the display panel shown in FIG. 17 along direction AA'.

Embodiments of the present disclosure further provide a display panel whose schematic structural views are shown in FIG. 17 and FIG. 18, which is a modification of the implementation manner in the above-mentioned embodiments. The following only describes differences of the embodiments and the above-mentioned embodiments, and similarities thereof are not repeated herein.

In some implementations, in the embodiments of the present disclosure, as shown in FIG. 17 and FIG. 18, the display area AA may further include: a plurality of second fan-out lines 150 located between a layer where the driving signal lines 110 are located and the base substrate 100, and a third insulating layer 730 located between the layer where the driving signal lines 110 are located and a layer where the second fan-out lines 150 are located. The third insulating layer 730 has a plurality of third via holes 731. One of the driving signal lines 110 may correspond to one of the second fan-out lines 150, and one of the second fan-out lines 150 may correspond to one of the bonding terminals 120. That is, one of the driving signal lines 110 is correspondingly electrically connected to one of the second fan-out lines 150 through the third via hole 731, and one of the second fan-out lines 150 is electrically connected to one of the bonding terminals 120 through the substrate via hole 200.

Exemplarily, in some implementations, in embodiments of the present disclosure, as shown in FIG. 17 and FIG. 18, the display area AA may further include: a plurality of first auxiliary lines 610 located between the third insulating layer 730 and the layer where the driving signal lines 110 are located, and a first insulating layer 710 located between the layer where the first auxiliary lines 610 are located and the layer where the driving signal lines 110 are located. It should be noted that, for the implementation manner of the first auxiliary lines 610 and the first insulating layer 710, reference can be made to the above-mentioned embodiments, and details will not be repeated herein.

Exemplarily, in some implementations, in embodiments of the present disclosure, as shown in FIG. 17 and FIG. 18, one of the driving signal lines 110 may correspond to one of the first auxiliary lines 610, and one of the first auxiliary lines 610 may correspond to one of the second fan-out lines 150. That is, one of the driving signal lines 110 is correspondingly electrically connected to one of the first auxiliary lines 610 through the first via hole 711, one of the first auxiliary lines 610 is correspondingly electrically connected to one of the second fan-out lines 150 through the third via hole 731, and one of the second fan-out lines 150 is electrically connected to one of the bonding terminals 120 through the substrate via hole 200.

Exemplarily, in some implementation, in embodiments of the present disclosure, as shown in FIG. 17 and FIG. 18, one of the first auxiliary lines 610 may correspond to one of the third via holes 731. The third via holes 731 may be arranged on a straight line L1 along the second direction F2. Alternatively, the third via holes 731 may be disposed dispersedly to improve the stability of the base substrate 100.

Exemplarily, in some implementations, in embodiments of the present disclosure, a distance from an orthographic projection of the substrate via hole 200 on the base substrate 100 to an orthographic projection of the third via hole 731 on the base substrate 100 may be substantially the same, thereby reducing the difference in resistances of the second fan-out lines 150 and reducing the difference in the delay of the signals input to the first auxiliary lines 610.

Based on the same inventive concept, embodiments of the present disclosure further provide a display device, including the above-mentioned display panel provided by the embodiments of the present disclosure. The principle of the display device to solve the problems is similar to that of the aforementioned display panel. Therefore, for the implementation of the display device, reference may be made to the implementation of the aforementioned display panel, and the repetition is not described herein.

In some implementations, in embodiments of the present disclosure, the display device may be: any product or component with a display function, such as a mobile phone, a tablet computer, a television, a display, a notebook computer, a digital photo frame and a navigator. Other essential components of the display device should be those provided to the understanding of those of ordinary skill in the art, and they will not be repeated herein and should not be taken as a limitation to the present disclosure.

It will be apparent that those skilled in the art can make various modifications and variations to the embodiments of the present disclosure without departing from the spirit and scope of the embodiments of the present disclosure. Thus, if such modifications and variations of the embodiments of the present disclosure fall within the scope of the claims of the present disclosure and the equivalent technologies thereof, the present disclosure is also intended to cover such modifications and variations.

What is claimed is:

1. A display panel, comprising:
   a base substrate, comprising a plurality of substrate via holes penetrating through the base substrate;
   a plurality of driving signal lines, on a first surface side of the base substrate;
   a plurality of bonding terminals, on a second surface side of the base substrate;
   a first insulating layer, between a layer where the driving signal lines are located and the base substrate, wherein the first insulating layer is provided with a plurality of first via holes; and
   a plurality of first auxiliary lines, between the first insulating layer and the base substrate;
   wherein an orthographic projection of at least one of the driving signal lines on the base substrate at least partially overlaps with an orthographic projection of at least one of the first auxiliary lines on the base substrate, and the at least one of the driving signal lines is electrically connected to the at least one of the first auxiliary lines through at least one of the first via holes;
   wherein the display panel further comprises:
   a second insulating layer, between a layer where first fan-out lines are located and the base substrate, wherein the second insulating layer is provided with a plurality of second via holes; and
   a plurality of second auxiliary lines, between the second insulating layer and the base substrate;
   wherein one of the driving signal lines is correspondingly electrically connected to one of the second auxiliary lines through at least one of the plurality of substrate via holes; and
   one of the second auxiliary lines is correspondingly electrically connected to one of the first fan-out lines through at least one of the plurality of second via holes.

2. The display panel according to claim 1, further comprising:
   a plurality of first fan-out lines, on the second surface side of the base substrate;
   wherein the at least one of the driving signal lines is electrically connected to at least one of the bonding terminals through at least one of the substrate via holes;
   one first fan-out line in the first fan-out lines is electrically connected to one bonding terminal in the bonding terminals;
   one of the driving signal lines is correspondingly electrically connected to at least one of the first fan-out lines through the at least one of the substrate via holes; and
   one of the first auxiliary lines is correspondingly electrically connected to the at least one of the first fan-out lines through the at least one of the substrate via holes.

3. The display panel according to claim 2, wherein at least two first via holes are spaced.

4. The display panel according to claim 3, wherein for the at least two first via holes corresponding to one driving signal line, a space between every adjacent two of the at least two first via holes is the same.

5. The display panel according to claim 4, wherein a distance from an orthographic projection of one of the plurality of bonding terminals on the base substrate to an orthographic projection of the substrate via hole corresponding to the one bonding terminal on the base substrate is substantially same as a distance from an orthographic projection of another one of the plurality of bonding terminals on the base substrate to an orthographic projection of the substrate via hole corresponding to the another one bonding terminal on the base substrate.

6. The display panel according to claim 5, wherein:
   the plurality of bonding terminals are sequentially spaced along a second direction;

with an area where the plurality of bonding terminals are located as a boundary, the base substrate is divided by the plurality of bonding terminals into a first side and a second side opposite to each other;

the first side and the second side are arranged along a first direction; and the plurality of substrate via holes are located in at least one side in the first side and the second side.

7. The display panel according to claim 6, wherein:
a part of the substrate via holes in the plurality of substrate via holes are located in the first side, and
a remaining part of the substrate via holes in the plurality of substrate via holes are located in the second side.

8. The display panel according to claim 7, wherein:
the substrate via holes corresponding to the odd-numbered first fan-out lines along the second direction are located in the first side, and
the substrate via holes corresponding to the even-numbered first fan-out lines are located in the second side.

9. The display panel according to claim 2, wherein:
one of the first fan-out lines corresponds to one of the substrate via holes;
one of the first auxiliary lines is correspondingly electrically connected to two of the first fan-out lines through two of the substrate via holes; and
one substrate via hole corresponding to one first auxiliary line is located in a first side of an area where the plurality of bonding terminals are located, and the other substrate via hole corresponding to the one first auxiliary line is located in a second side of the area where the plurality of bonding terminals are located.

10. The display panel according to claim 1, wherein:
orthographic projections of the driving signal line and the second auxiliary line corresponding to the driving signal line on the base substrate at least partially overlap, and
the driving signal line and the second auxiliary line corresponding to the driving signal line are electrically connected through at least two of the plurality of substrate via holes, wherein the at least two substrate via holes are spaced.

11. The display panel according to claim 10, wherein for the at least two substrate via holes corresponding to one driving signal line, a space between every adjacent two of the at least two substrate via holes is the same.

12. The display panel according to claim 1, wherein the substrate via holes corresponding to every two adjacent driving signal lines are arranged:
on a straight line along a second direction; or
in a staggered manner.

13. The display panel according to claim 1, wherein:
the driving signal lines extend along a first direction,
the base substrate has a symmetry axis along a second direction;
the first direction and the second direction are different; and
all the second via holes are located in the symmetry axis of the base substrate.

14. The display panel according to claim 1, further comprising:
a plurality of second fan-out lines, between a layer where the driving signal lines are located and the base substrate; and
a third insulating layer, between the layer where the driving signal lines are located and a layer where the second fan-out lines are located, wherein the third insulating layer is provided with a plurality of third via holes;

wherein:
one of the driving signal lines is correspondingly electrically connected to one of the second fan-out lines through at least one of the plurality of third via holes, and
one of the second fan-out lines is correspondingly electrically connected to one of the plurality of bonding terminals through at least one of the plurality of substrate via holes.

15. The display panel according to claim 1, wherein:
the driving signal lines extend along a first direction;
the base substrate has a symmetry axis along a second direction;
the first direction and the second direction are different;
one of the driving signal lines corresponds to one of the substrate via holes; and
the substrate via holes are located in an area from the symmetry axis to an edge of the base substrate.

16. The display panel according to claim 15, wherein all the substrate via holes are arranged on a straight line along the second direction.

17. The display panel according to claim 15, wherein:
all the substrate via holes are located in a same side of the symmetry axis and are close to the edge of the base substrate; or
all the substrate via holes are located in the symmetry axis.

18. A display device, comprising a display panel, wherein the display panel comprises:
a base substrate, comprising a plurality of substrate via holes penetrating through the base substrate;
a plurality of driving signal lines, on a first surface side of the base substrate;
a plurality of bonding terminals, on a second surface side of the base substrate;
a first insulating layer, between a layer where the driving signal lines are located and the base substrate, wherein the first insulating layer is provided with a plurality of first via holes; and
a plurality of first auxiliary lines, between the first insulating layer and the base substrate;
wherein an orthographic projection of at least one of the driving signal lines on the base substrate at least partially overlaps with an orthographic projection of at least one of the first auxiliary lines on the base substrate, and the at least one of the driving signal lines is electrically connected to the at least one of the first auxiliary lines through at least one of the first via holes;
wherein the display panel further comprises:
a second insulating layer, between a layer where first fan-out lines are located and the base substrate, wherein the second insulating layer is provided with a plurality of second via holes; and
a plurality of second auxiliary lines, between the second insulating layer and the base substrate;
wherein one of the driving signal lines is correspondingly electrically connected to one of the second auxiliary lines through at least one of the plurality of substrate via holes; and
one of the second auxiliary lines is correspondingly electrically connected to one of the first fan-out lines through at least one of the plurality of second via holes.

* * * * *